(12) United States Patent
Jung et al.

(10) Patent No.: US 12,461,408 B2
(45) Date of Patent: Nov. 4, 2025

(54) DISPLAY DEVICE COMPRISING MOUNTING CONNECTORS AND DRIVER CHIPS THAT ARE ALTERNATELY DISPOSED IN A LENGTH DIRECTION OF AN EXTENSION BOARD

(71) Applicant: LG ELECTRONICS INC., Seoul (KR)

(72) Inventors: Moongu Jung, Seoul (KR); Minho Kim, Seoul (KR); Seunghwan Shim, Seoul (KR); Byungwoo Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 18/645,862

(22) Filed: Apr. 25, 2024

(65) Prior Publication Data

US 2024/0377669 A1   Nov. 14, 2024

(30) Foreign Application Priority Data

May 10, 2023   (KR) ......................... 10-2023-0060392

(51) Int. Cl.
| | |
|---|---|
| G02F 1/1333 | (2006.01) |
| G02F 1/13357 | (2006.01) |
| G02F 1/1345 | (2006.01) |
| H05K 1/14 | (2006.01) |

(52) U.S. Cl.
CPC ...... *G02F 1/133308* (2013.01); *G02F 1/1336* (2013.01); *G02F 1/13452* (2013.01); *H05K 1/148* (2013.01); *H05K 2201/10106* (2013.01); *H05K 2201/10136* (2013.01)

(58) Field of Classification Search
CPC .......................................... H05K 2201/10136
See application file for complete search history.

(56) References Cited

U.S. PATENT DOCUMENTS

| | | | |
|---|---|---|---|
| 8,305,516 B2 * | 11/2012 | Cho .................. | G02F 1/133603 |
| | | | 362/612 |
| 2010/0165240 A1 * | 7/2010 | Cho .................. | G02F 1/133603 |
| | | | 349/61 |
| 2023/0055132 A1 * | 2/2023 | Lee .................... | G02F 1/133608 |

FOREIGN PATENT DOCUMENTS

| | | | | |
|---|---|---|---|---|
| CN | 111290174 A | * | 6/2020 | ....... G02F 1/133603 |
| CN | 215417317 | | 1/2022 | |
| CN | 114220358 A | * | 3/2022 | ....... G02F 1/133317 |
| EP | 4400906 | | 7/2024 | |

(Continued)

OTHER PUBLICATIONS

European Patent Office Application Serial No. 24173272.6, Search Report dated Oct. 7, 2024, 9 pages.

(Continued)

*Primary Examiner* — Paul C Lee
(74) *Attorney, Agent, or Firm* — LEE, HONG, DEGERMAN, KANG & WAIMEY

(57) ABSTRACT

A display device may include a display panel; a frame which is positioned behind the display panel, and to which the display panel is coupled; a plurality of substrates positioned between the display panel and the frame, and coupled to the frame; a plurality of light sources positioned on the plurality of substrates; and an extension board which includes a driver chip, which extends in a direction intersecting the plurality of substrates, and to which the plurality of substrates are coupled.

15 Claims, 32 Drawing Sheets

(56) References Cited

FOREIGN PATENT DOCUMENTS

| | | | | | |
|---|---|---|---|---|---|
| JP | 2009139930 A | * | 6/2009 | ....... | G02F 1/133603 |
| KR | 10-2008-0085956 | | 9/2008 | | |
| KR | 10-2015-0010396 | | 1/2015 | | |
| KR | 10-2017-0083248 | | 7/2017 | | |
| KR | 10-2021-0000108 | | 1/2021 | | |
| KR | 10-2023-0003941 | | 1/2023 | | |

OTHER PUBLICATIONS

Korean Intellectual Property Office Application No. 10-2023-0060392 Office Action dated Oct. 8, 2024, 6 pages.

* cited by examiner

DISPLAY DEVICE COMPRISING MOUNTING CONNECTORS AND DRIVER CHIPS THAT ARE ALTERNATELY DISPOSED IN A LENGTH DIRECTION OF AN EXTENSION BOARD

CROSS-REFERENCE TO RELATED APPLICATION

Pursuant to 35 U.S.C. § 119 (a), this application claims the benefit of earlier filing date and right of priority to Korean Patent Application No. 10-2023-0060392, filed on May 10, 2023, the contents of which are hereby incorporated by reference herein in its entirety.

BACKGROUND OF THE INVENTION

Field of the Invention

The present disclosure relates to a display device.

Description of the Related Art

As the information society develops, the demand for display devices is also increasing in various forms. In response to this, various display devices such as Liquid Crystal Display Device (LCD), Plasma Display Panel (PDP), Electroluminescent Display (ELD), Vacuum Fluorescent Display (VFD), and Organic Light Emitting Diode (OLED) have been researched and used in recent years.

Among these, the liquid crystal panel includes a TFT substrate and a color filter substrate facing each other with a liquid crystal layer interposed therebetween, and may display an image by using light provided from a backlight unit.

Recently, many studies have been conducted on a structure of a substrate on which a light source such as an LED is mounted. In addition, many studies have been conducted to improve the quality of an image displayed by a display panel.

SUMMARY OF THE INVENTION

It is an objective of the present disclosure to solve the above and other problems.

Another objective of the present disclosure may be to provide a structure capable of minimizing the number of connectors and cables that connect a LED driver and LED substrates even if the number of local dimming blocks is large.

Another objective of the present disclosure may be to provide a structure capable of reducing the cost and working time required for connectors and cables and simplifying the layout of a frame.

Another objective of the present disclosure may be to provide a structure capable of combining a LED driver board with a main board or a power supply board.

Another objective of the present disclosure may be to provide a coupling structure between an extension board having a driver IC and substrates.

Another objective of the present disclosure may be to provide a various examples of the shape of the substrates connected by an extension board.

In accordance with an aspect of the present disclosure, a display device may include a display panel; a frame which is positioned behind the display panel, and to which the display panel is coupled; a plurality of substrates positioned between the display panel and the frame, and coupled to the frame; a plurality of light sources positioned on the plurality of substrates; and an extension board which includes a driver chip, which extends in a direction intersecting the plurality of substrates, and to which the plurality of substrates are coupled.

BRIEF DESCRIPTION OF THE DRAWINGS

The above and other objects, features and advantages of the present invention will be more apparent from the following detailed description in conjunction with the accompanying drawings, in which.

DETAILED DESCRIPTION

Figure 1:
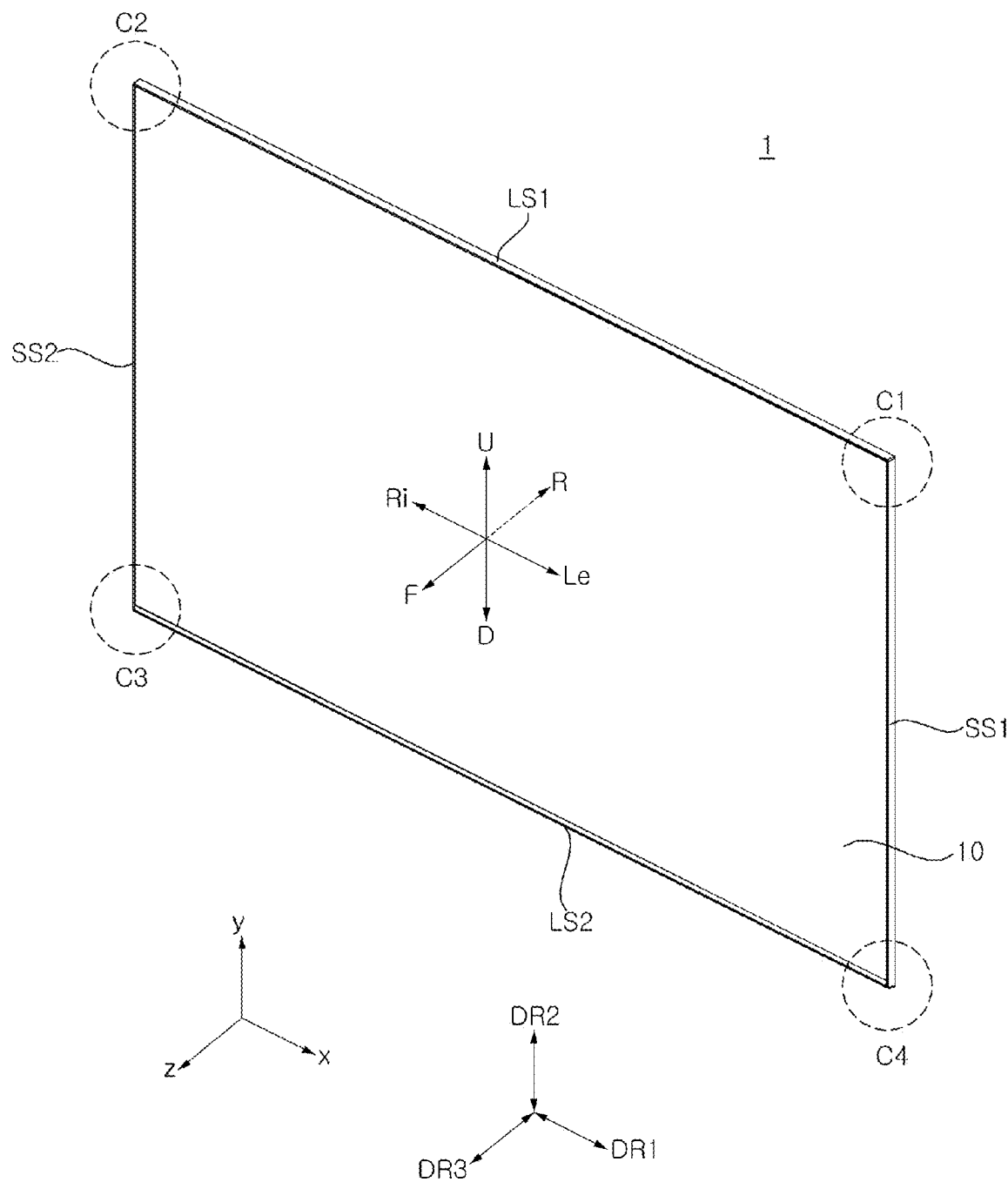
FIGS. 1 to 32 are diagrams illustrating examples of a display device according to embodiments of the present disclosure.

Description will now be given in detail according to exemplary embodiments disclosed herein, with reference to the accompanying drawings. For the sake of brief description with reference to the drawings, the same or equivalent components may be denoted by the same reference numbers, and description thereof will not be repeated.

In general, suffixes such as "module" and "unit" may be used to refer to elements or components. Use of such suffixes herein is merely intended to facilitate description of the specification, and the suffixes do not have any special meaning or function.

In the present disclosure, that which is well known to one of ordinary skill in the relevant art has generally been omitted for the sake of brevity. The accompanying drawings are used to assist in easy understanding of various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected with" another element, there may be intervening elements present. In contrast, it will be understood that when an element is referred to as being "directly connected with" another element, there are no intervening elements present.

A singular representation may include a plural representation unless context clearly indicates otherwise.

In the following description, even if the embodiment is described with reference to specific drawings, if necessary, reference numerals not appearing in the specific drawings may be referred to, and reference numerals not appearing in the specific drawings are used in a case where the above reference numerals appear in the other figures.

Direction indications of up (U), down (D), left (Le), right (Ri), front (F), and rear (R) shown in the drawings are only for convenience of explanation, and the technical concept disclosed in this specification is not limited thereto.

Referring to FIG. 1, a display device 1 may include a display panel 10. The display panel 10 may display an image.

The display device 1 may include a first long side LS1, a second long side LS2 opposite to the first long side LS1, a first short side SS1 adjacent to the first long side LS1 and the second long side LS2, and a second short side SS2 opposite to the first short side SS1. Meanwhile, for convenience of explanation, it is illustrated that the lengths of the first and second long sides LS1 and LS2 are longer than the lengths of the first and second short sides SS1 and SS2, but it may be possible that the lengths of the first and second long sides LS1 and LS2 are approximately the same as the lengths of the first and second short sides SS1 and SS2.

A direction parallel to the long sides LS1 and LS2, of the display device 1 may be referred to as a left-right direction or a first direction DR1. The side of the first short side SS1 may be referred to as a left side (Le, x), and the side of the second short side SS2 may be referred to as a right side Ri.

A direction parallel to the short sides SS1 and SS2, of the display device 1 may be referred to as an up-down direction or a second direction DR2. The side of the first long side LS1 may be referred to as an upper side (U, y), and the side of the second long side LS2 may be referred to as a lower side D.

A direction perpendicular to the long sides LS1 and LS2 and the short sides SS1 and SS2 of the display device 1 may be referred to as a front-rear direction or a third direction DR3. A direction in which the display panel 10 displays an image may be referred to as front (F, z), and a direction opposite to this may be referred to as rear (R).

The first long side LS1, the second long side LS2, the first short side SS1, and the second short side SS2 may be referred to as an edge of the display device 1. In addition, a point where the first long side LS1, the second long side LS2, the first short side SS1, and the second short side SS2 meet each other may be referred to as a corner. A point where the first short side SS1 and the first long side LS1 meet may be referred to as a first corner C1. A point where the first long side LS1 and the second short side SS2 meet may be referred to as a second corner C2. A point where the second short side SS2 and the second long side LS2 meet may be referred to as a third corner C3. A point where the second long side LS2 and the first short side SS1 meet may be referred to as a fourth corner C4.

Figure 2:
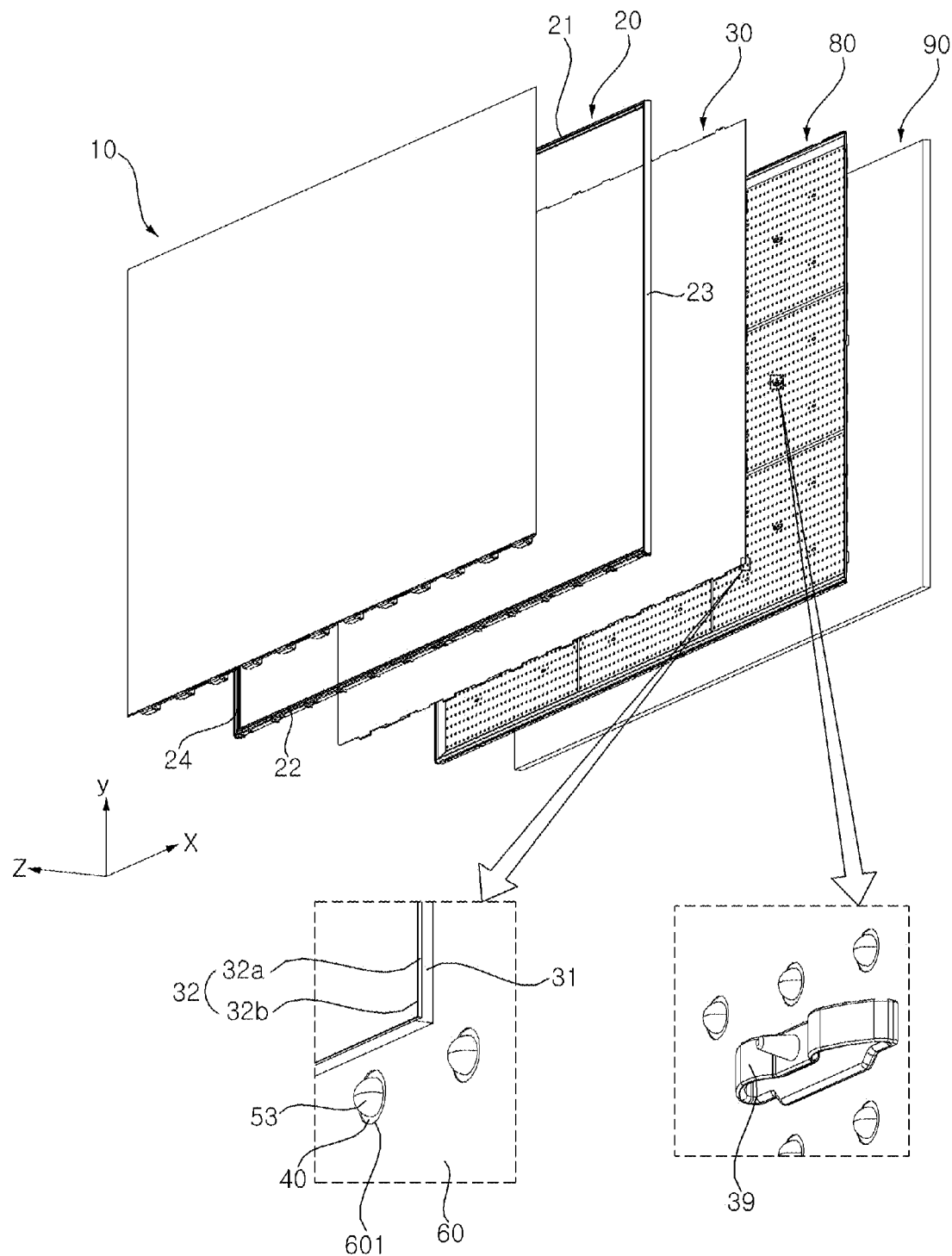

Referring to FIG. 2, the display device 1 may include a display panel 10, a side frame 20, a backlight unit, a frame 80, and a back cover 90.

The display panel 10 may form the front surface of the display device 1, and display an image. The display panel 10 may display an image by having a plurality of pixels that output Red, Green, or Blue (RGB) color for each pixel according to a timing. The display panel 110 may be divided into an active area which displays an image and a de-active area which does not display an image. The display panel 110 may include a front substrate and a rear substrate opposite to each other with a liquid crystal layer interposed therebetween. The display panel 10 may be referred to as an LCD panel 10.

The front substrate may include a plurality of pixels including red, green, and blue sub-pixels. The front substrate may output light corresponding to a color of red, green, or blue according to a control signal.

The rear substrate may include switching elements. The rear substrate may switch a pixel electrode. For example, the pixel electrode may change the molecular arrangement of the liquid crystal layer according to an externally inputted control signal. The liquid crystal layer may include liquid crystal molecules. The arrangement of the liquid crystal molecules may be changed in response to a voltage difference generated between the pixel electrode and a common electrode. The liquid crystal layer may transmit light provided from the backlight unit to the front substrate, or block the light.

The side frame 20 may extend along the edge of the display panel 10. The side frame 20 may cover an edge of the display panel 10. For example, the side frame 20 may include a plastic or metal material. The side frame 20 may be referred to as a guide panel 20.

The backlight unit may be located in a rear of the display panel 10. The backlight unit may be located in front of the frame 80 and may be coupled to the frame 80. The backlight unit may be driven by a full driving method or a partial driving method such as a local dimming, and an impulsive. The backlight unit may include light sources that provide light forward, a substrate 40 on which the light sources are mounted, lenses 53 that covers the light sources, a reflective sheet 60 that covers the front surface of the substrate 40, and an optical unit 30 located in front of the reflective sheet 60.

The optical unit 30 may be opposite to the display panel 10 with respect to the side frame 20. The optical unit 30 may evenly transmit the light of the light source to the display panel 10. The optical unit 30 may include a diffusion plate 31 and an optical sheet 32.

The diffusion plate 31 may be located between the reflective sheet 60 and the optical sheet 32. The diffusion plate 31 may diffuse the light of the light source. In addition, an air gap may be formed between the reflective sheet 60 and the diffusion plate 31. The air gap may serve as a buffer, and the light of the light source may be widely spread by the air gap. A supporter 39 may be located between the reflective sheet 60 and the diffusion plate 31, may be coupled to the reflective sheet 60, and may support the diffusion plate 31.

The optical sheet 32 may be adjacent to or in contact with the front surface of the diffusion plate 31. The optical sheet 32 may include at least one sheet. For example, the optical sheet 32 may include a plurality of sheets having different functions, and the plurality of sheets may be adhered to or in close contact with each other. For example, the first optical sheet 32a may be a diffusion sheet, and the second optical sheet 32b may be a prism sheet. The diffusion sheet prevents partial concentration of light emitted from the diffusion plate 31 to uniformly distribute light. The prism sheet may condense the light emitted from the diffusion sheet and provide it to the display panel 10. The number and/or location of the diffusion sheet and the prism sheet may be changed.

For example, the optical sheet 32 may change the wavelength or color of light provided from the light source. For example, the optical sheet 32 may include a red-based phosphor and/or a green-based phosphor. In this case, the light source may provide blue light, and the optical sheet 32 may change the light of the light source into white light. The optical sheet 32 may be referred to as a Quantum Dot QD sheet.

The frame 80 may be located in a rear of the backlight unit. The display panel 10, the side frame 20, and the backlight unit may be coupled to the frame 80. The frame 80 may support configurations of the display device described above and below. For example, the frame 80 may include a metal material such as aluminum alloy. The frame 80 may be referred to as a main frame 80, a module cover 80, or a cover bottom 80.

The back cover 90 may cover the rear of the frame 80, and may be coupled to the frame 80. For example, the back cover 90 may be an injection product made of resin. For another example, the back cover 90 may include a metal material.

Figure 3:
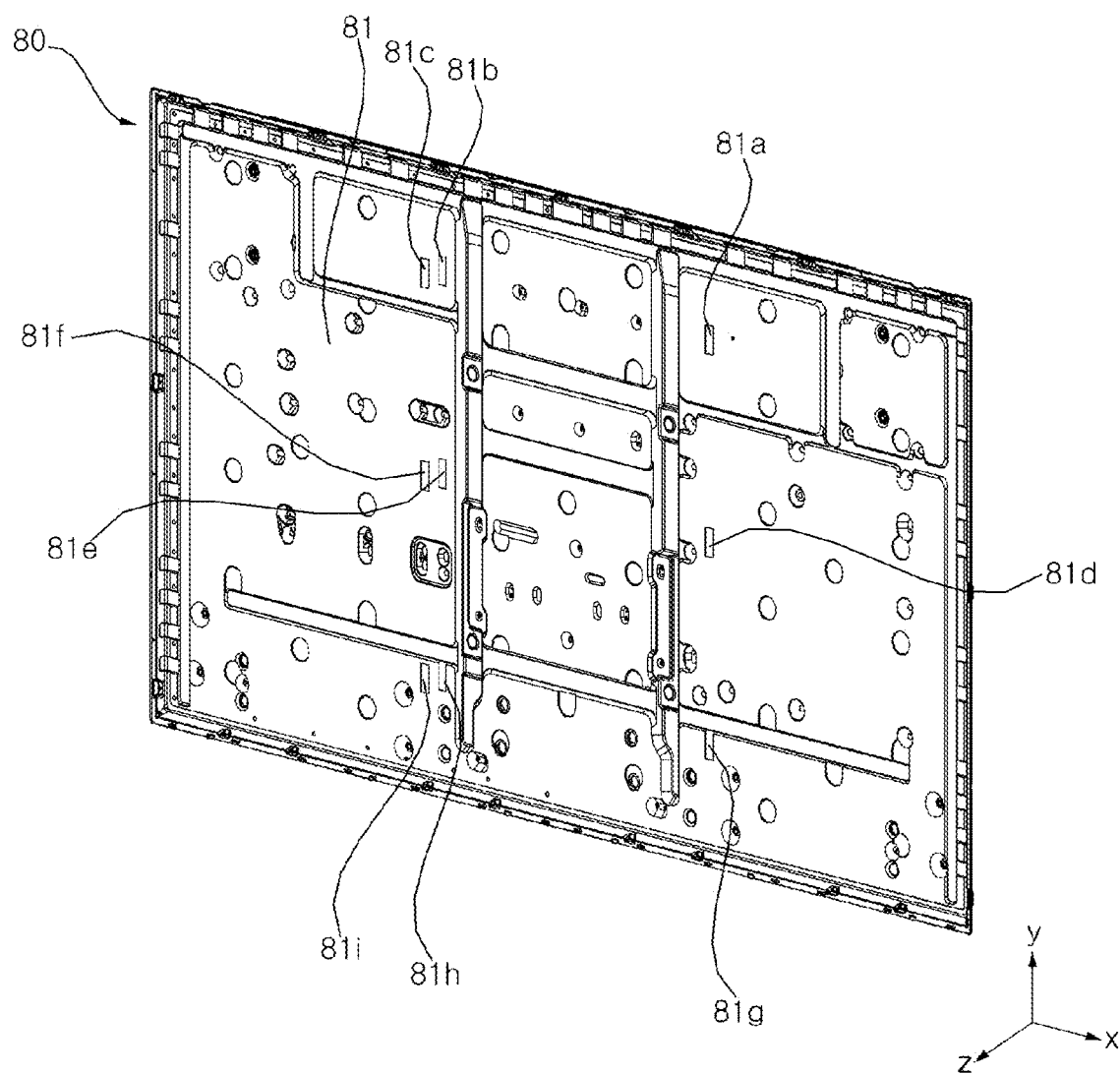

Referring to FIG. 3, a flat plate part 81 may define the front surface of the frame 80. A plurality of frame holes 81*a*, 81*b*, 81*c*, 81*d*, 81*e*, 81*f*, 81*g*, 81*h*, and 81*i* may be formed in the flat plate part 81.

Figure 4:
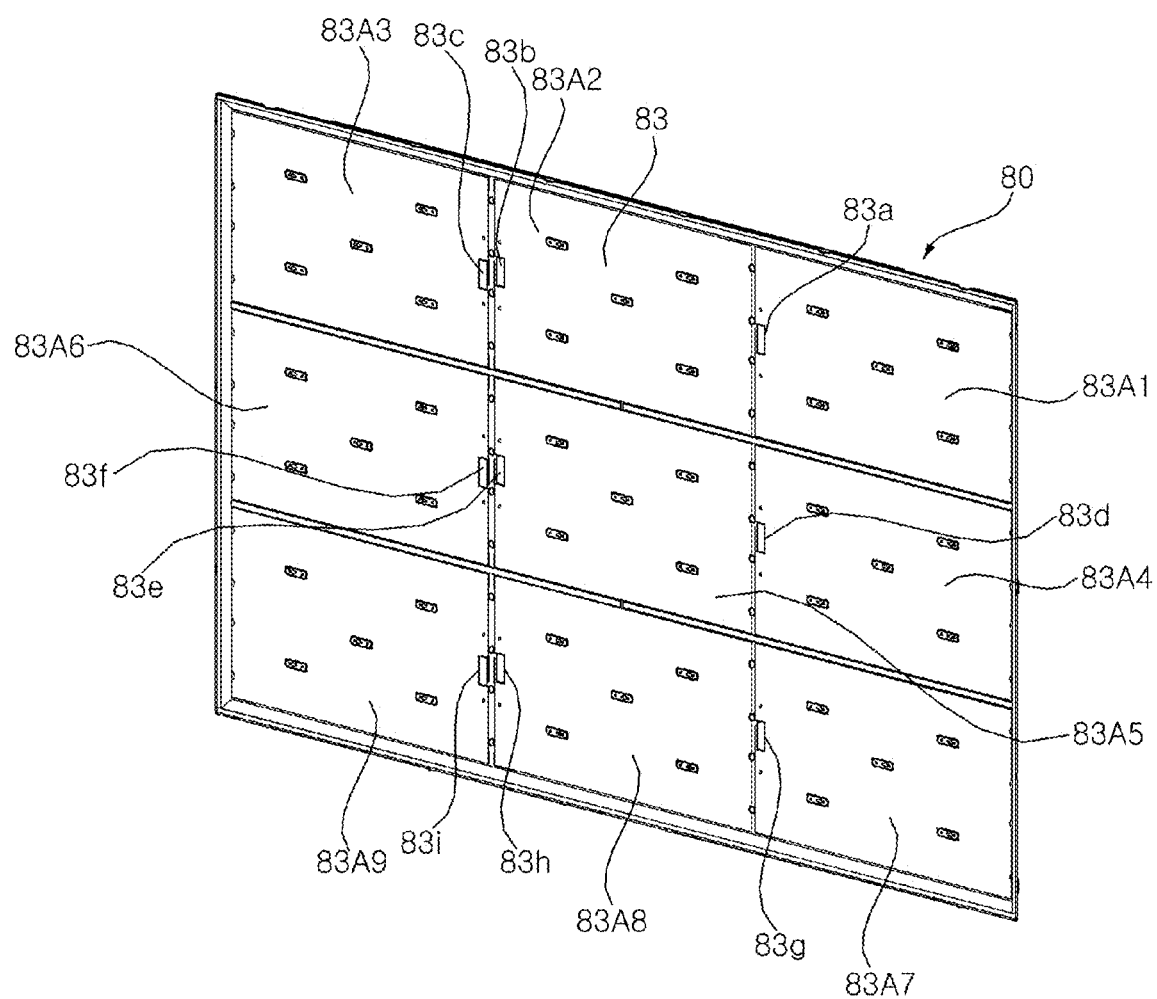

Referring to FIGS. 3 and 4, a heat dissipation plate 83 may cover the front surface of the flat plate part 81 and may be coupled to the flat plate part 81. A plurality of heat dissipation plate holes 83*a*, 83*b*, 83*c*, 83*d*, 83*e*, 83*f*, 83*g*, 83*h*, and 83*i* may be formed in the heat dissipation plate 83, and aligned with a plurality of frame holes 81*a*, 81*b*, 81*c*, 81*d*, 81*e*, 81*f*, 81*g*, 81*h*, and 81*i*. The heat dissipation plate 83 may be omitted.

Figure 5:
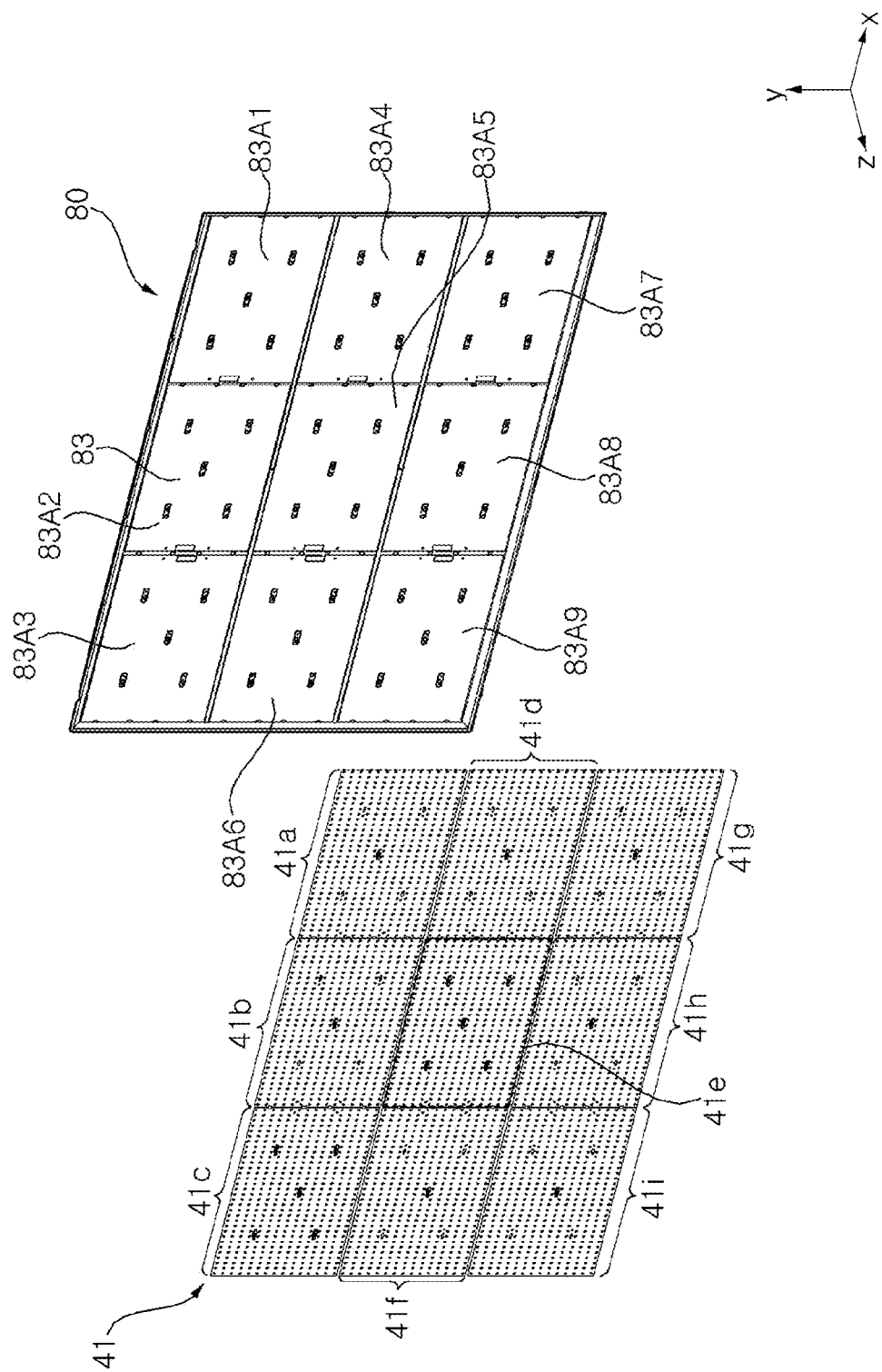
Figure 6:
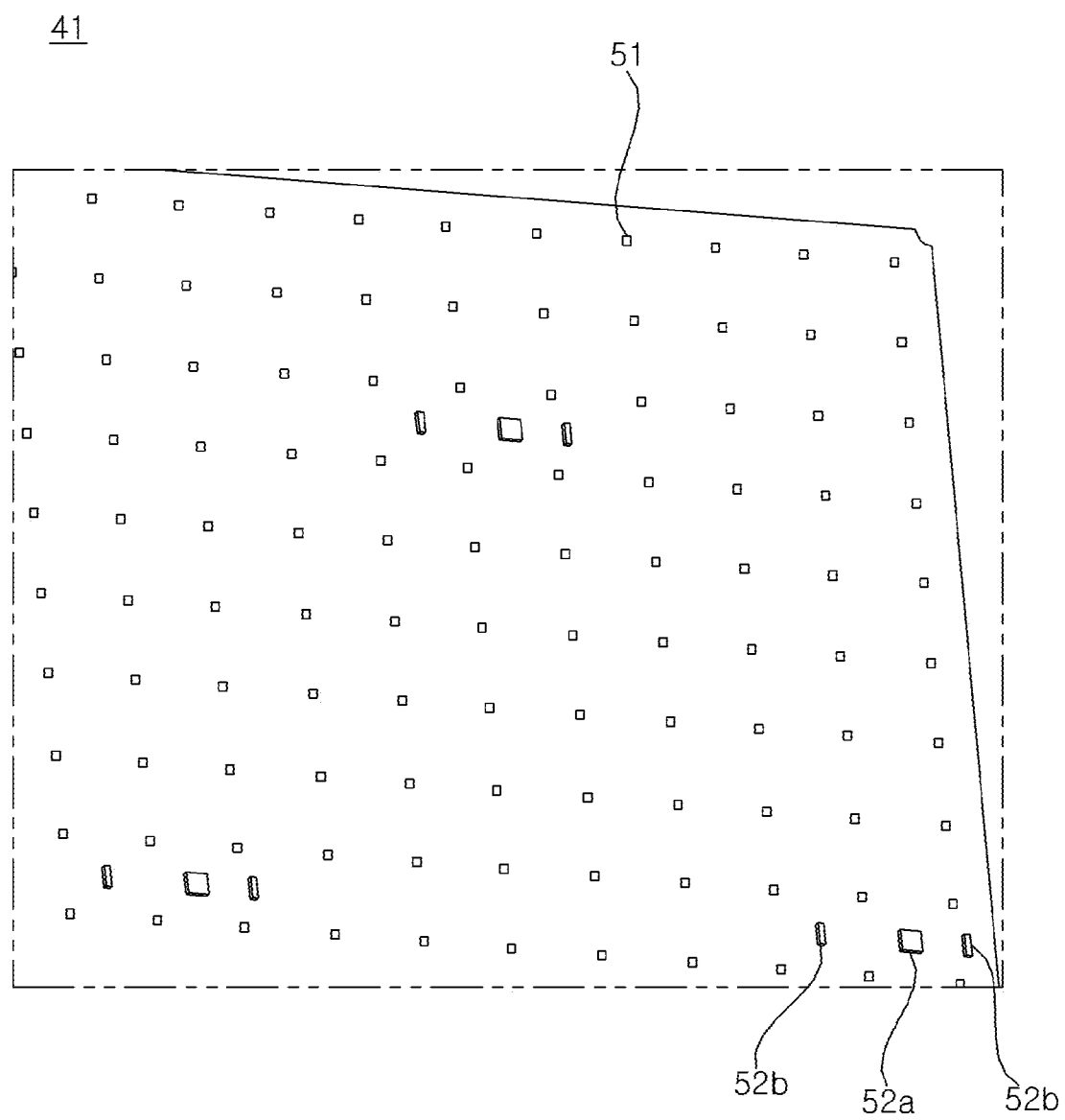

Referring to FIGS. 5 and 6, a substrate 41 may be coupled to the front surface of the frame 80 or the heat dissipation plate 83. The substrate 41 may be a Printed Circuit Board PCB. For example, the substrate 41 may include at least one of polyethylene terephthalate PET, glass, polycarbonate PC, or silicon. The substrate 41 may have a plate shape.

At least one substrate 41 may be provided. Each of a plurality of substrates 41*a*, 41*b*, 41*c*, 41*d*, 41*e*, 41*f*, 41*g*, 41*h*, and 41*i* may cover each of a plurality of areas 83A1, 83A2, 83A3, 83A4, 83A5, 83A6, 83A7, 83A8, and 83A9 of the heat dissipation plate 83.

A light source 51 may be mounted on the front surface of the substrate 41. A plurality of light sources 51 may be disposed in a matrix form on the front surface of the substrate 41. The light source 51 may be a light emitting diode LED chip or an LED package. The light source 51 may include a colored LED emitting at least one color among colors such as red, green, and blue, or a white LED. The light source 51 may be a mini LED. An electrode pattern may be formed on the substrate 41, and an adapter (connector) may be connected to the light source 51. The power supply board may provide power to the light source 51 through the substrate 41. For example, the electrode pattern may be a carbon nanotube electrode pattern.

An integrated element 52*a* and a capacitor 52*b* may be located around the light source 51, and may be mounted on the front surface of the substrate 41. The integrated element 52*a* may be an IC chip. A plurality of capacitors 52*b* may be opposite to each other with respect to the integrated element 52*a*. The integrated element 52*a* may adjust power provided to a certain number of light sources 51.

Figure 7:
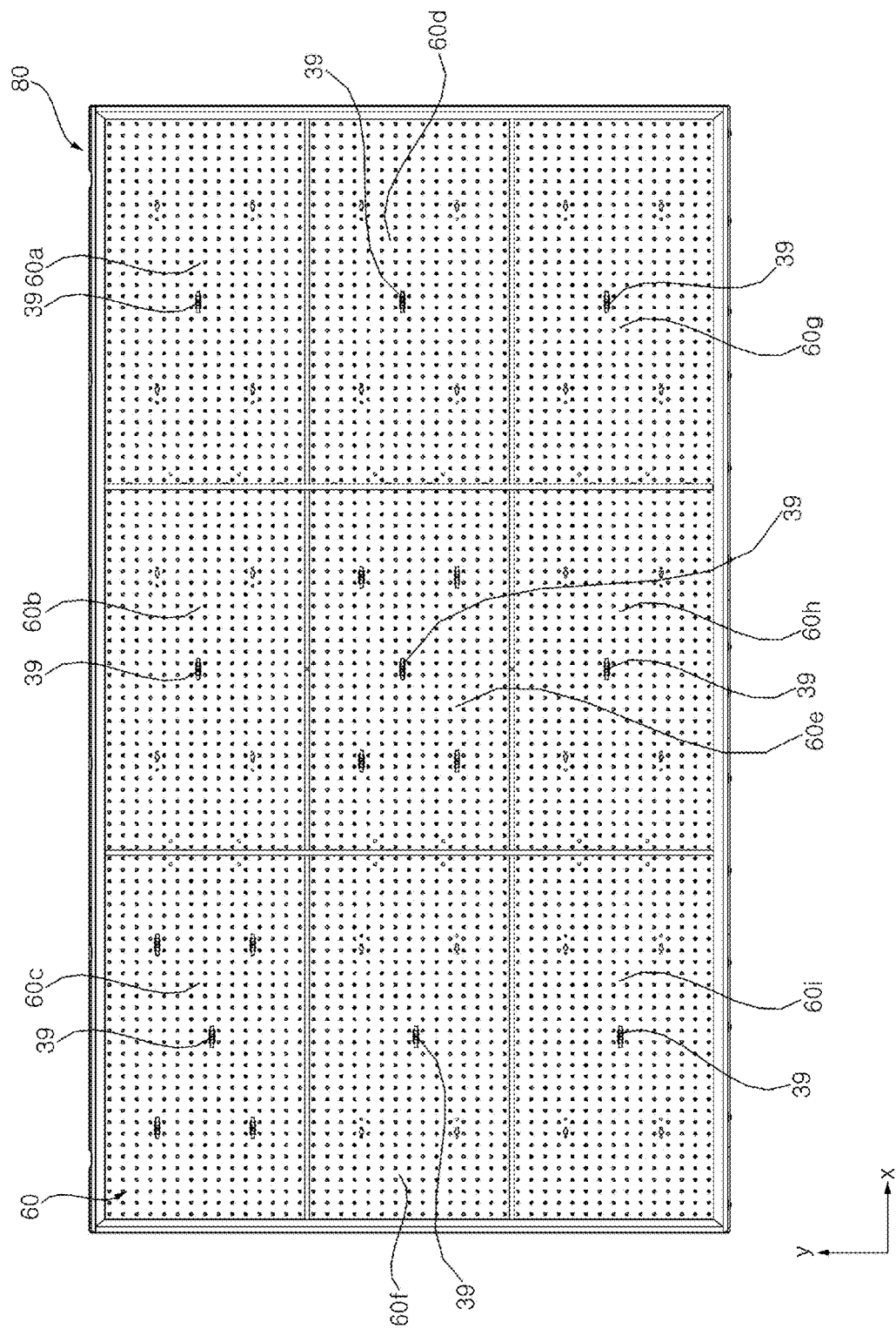
Figure 8:
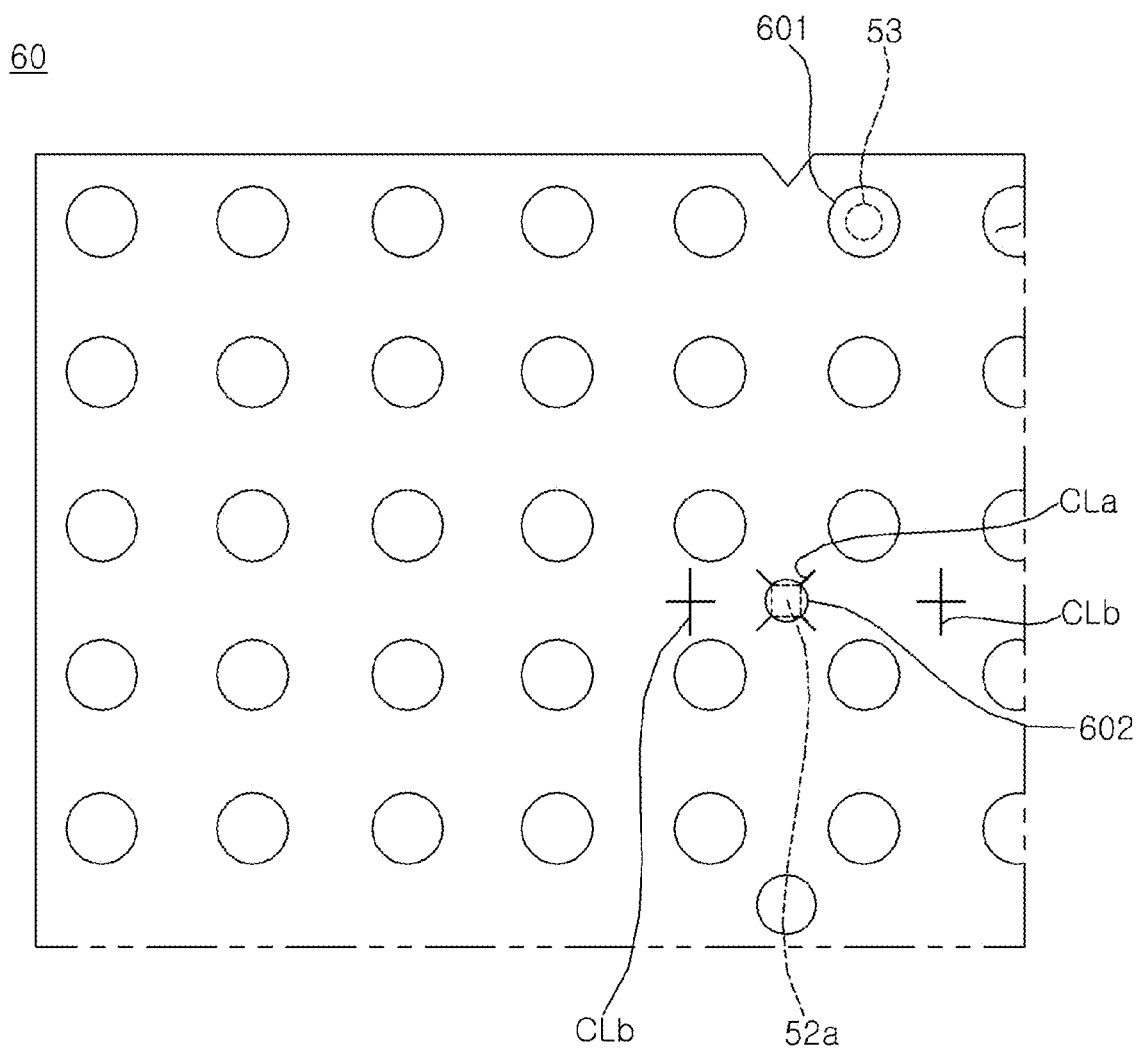

Referring to FIGS. 7 and 8, the reflective sheet 60 may be coupled to the front surface of the substrate 41 (see FIG. 5). The reflective sheet 60 may reflect light provided from the light source 51 or reflected from the diffusion plate 31 in a forward direction (see FIG. 2). For example, the reflective sheet 60 may include a metal having a high reflectance such as at least one of aluminum Al, silver Ag, gold Au, or titanium dioxide TiO 2 and/or a metal oxide. For example, resin may be deposited or coated on the reflective sheet 60. At least one reflective sheet 60 may be provided. A plurality of reflective sheets 60*a*, 60*b*, 60*c*, 60*d*, 60*e*, 60*f*, 60*g*, 60*h*, and 60*i* may cover the substrate(s) 41 (see FIG. 5).

A hole 601 may be formed in the reflective sheet 60, and the light source 51 (see FIG. 6) or the lens 53 covering the light source 51 may be located in the hole 601. The diameter of the hole 601 may be larger than the diameter of the lens 53. The number of holes 601 may be the same as the number of light sources 51 or lenses 53.

An accommodating hole 602 may be formed in the reflective sheet 60, and the integrated element 52*a* (see FIG. 6) may be located in the accommodating hole 602. A first cutting line CLa around the accommodating hole 602 may be widened by the integrated element 52*a*. Cross-shaped second cutting lines CLb may be formed in the reflective sheet 60, and may face each other with respect to the first cutting line CLa. Capacitors 52*b* (see FIG. 6) may be located in the second cutting lines CLb, and the second cutting lines CLb may be widened by the capacitors 52*b*. Accordingly, the reflective sheet 60 may adhere to the substrate 41, and light uniformity may be improved.

Meanwhile, the supporter 39 may penetrate the reflective sheet 60 and the substrate 41, and be detachably coupled to the heat dissipation plate 83 and/or the frame 80 (see FIG. 5). A plurality of supporters 39 spaced apart from each other may be disposed on the reflective sheet 60. The front end of the supporter 39 may support the rear surface of the diffusion plate 31 (see FIG. 2).

Figure 9:
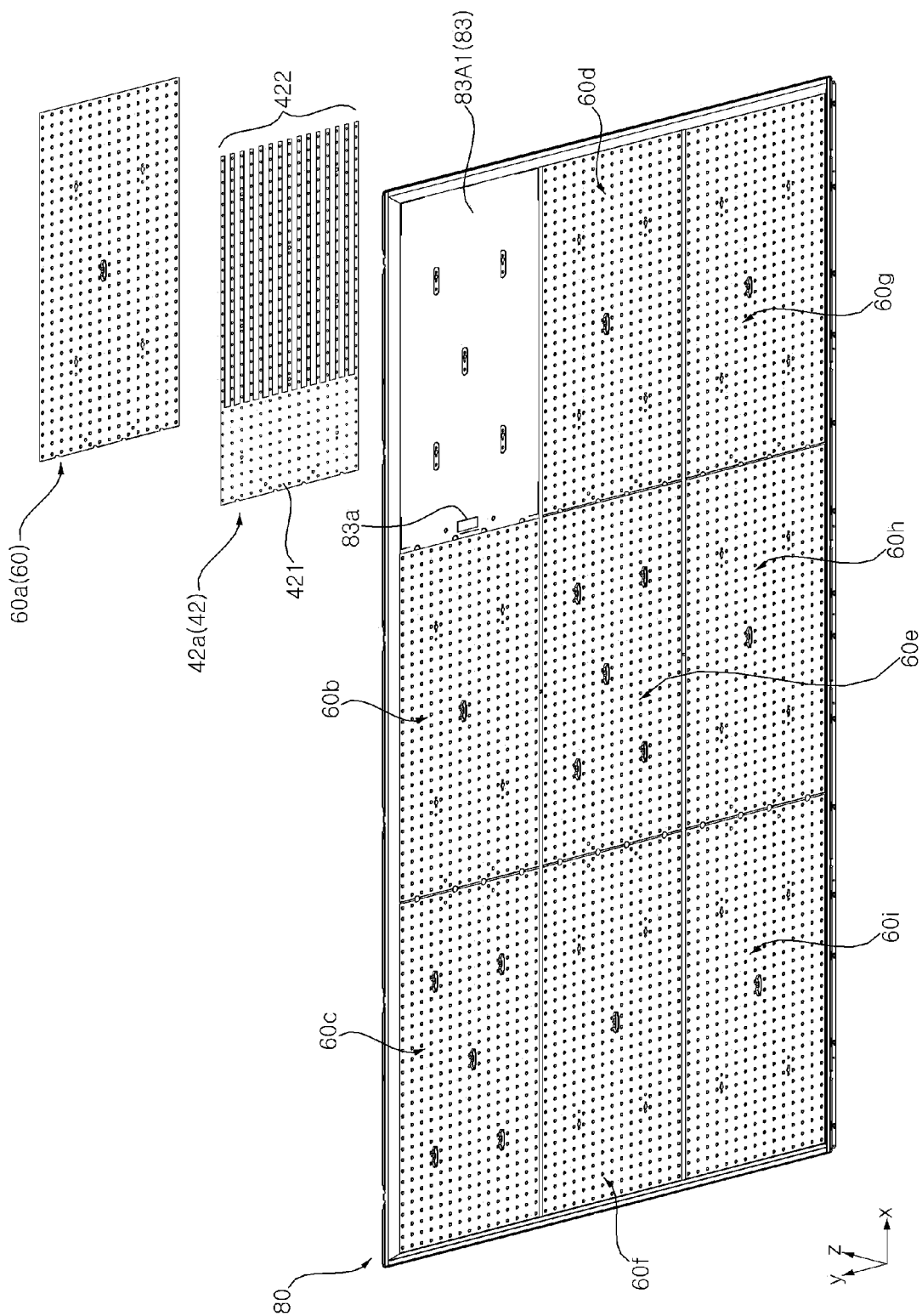
Figure 10:
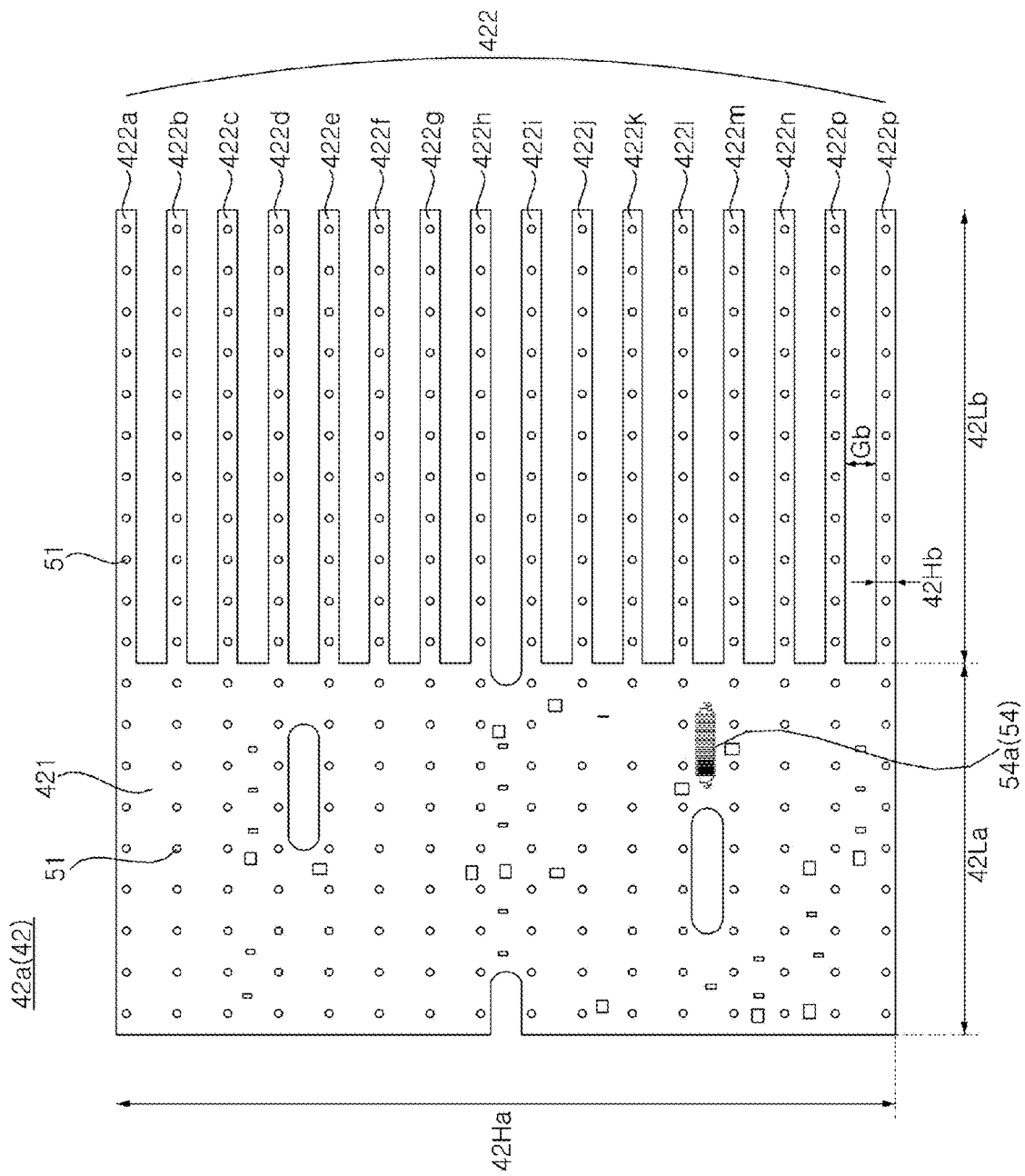

Referring to FIGS. 9 and 10, the substrate 42 may be coupled to the front surface of the frame 80 or the heat dissipation plate 83. The substrate 42 may be a Printed Circuit Board (PCB). For example, the substrate 42 may include at least one of polyethylene terephthalate PET, glass, polycarbonate PC, or silicon. The substrate 42 may have a fork shape.

The substrate 42 may include a body 421 and legs 422. The body 421 may be elongated. The legs 422 may extend from one long side of the body 421 in a direction intersecting the body 421. The length direction of the body 421 may be defined in a vertical direction, and the length direction of the legs 422 may be defined in a horizontal direction. The width 42La of the body 421 may be smaller than the length 42Ha of the body 421, and may be smaller than or similar to the length 42Lb of the legs 422. The legs 422 may be spaced apart from each other in the length direction of the body 421. The gap Gb between the legs 422 may be equal to the width 42Hb of the leg 422.

At least one substrate 42 may be provided. Each of the plurality of substrates 42 may cover each of the plurality of areas 83A1, 83A2, 83A3, 83A4, 83A5, 83A6, 83A7, 83A8, and 83A9 (see FIG. 4) of the heat dissipation plate 83.

The light source 51 may be mounted on the front surface of the substrate 42. The plurality of light sources 51 may be arranged in a matrix form on the front surface of the body 421 and the legs 422. The integrated device and capacitor may be located around the light source 51, and may be mounted on the front surface of the substrate 42. The reflective sheet 60 may be coupled to the front surface of the substrate 42 and may have a hole in which the light source 51 or a lens covering the light source 51 is located. The plurality of reflective sheets 60*a*, 60*b*, 60*c*, 60*d*, 60*e*, 60*f*, 60*g*, 60*h*, and 60*i* may cover the substrate(s) 42.

Figure 11:
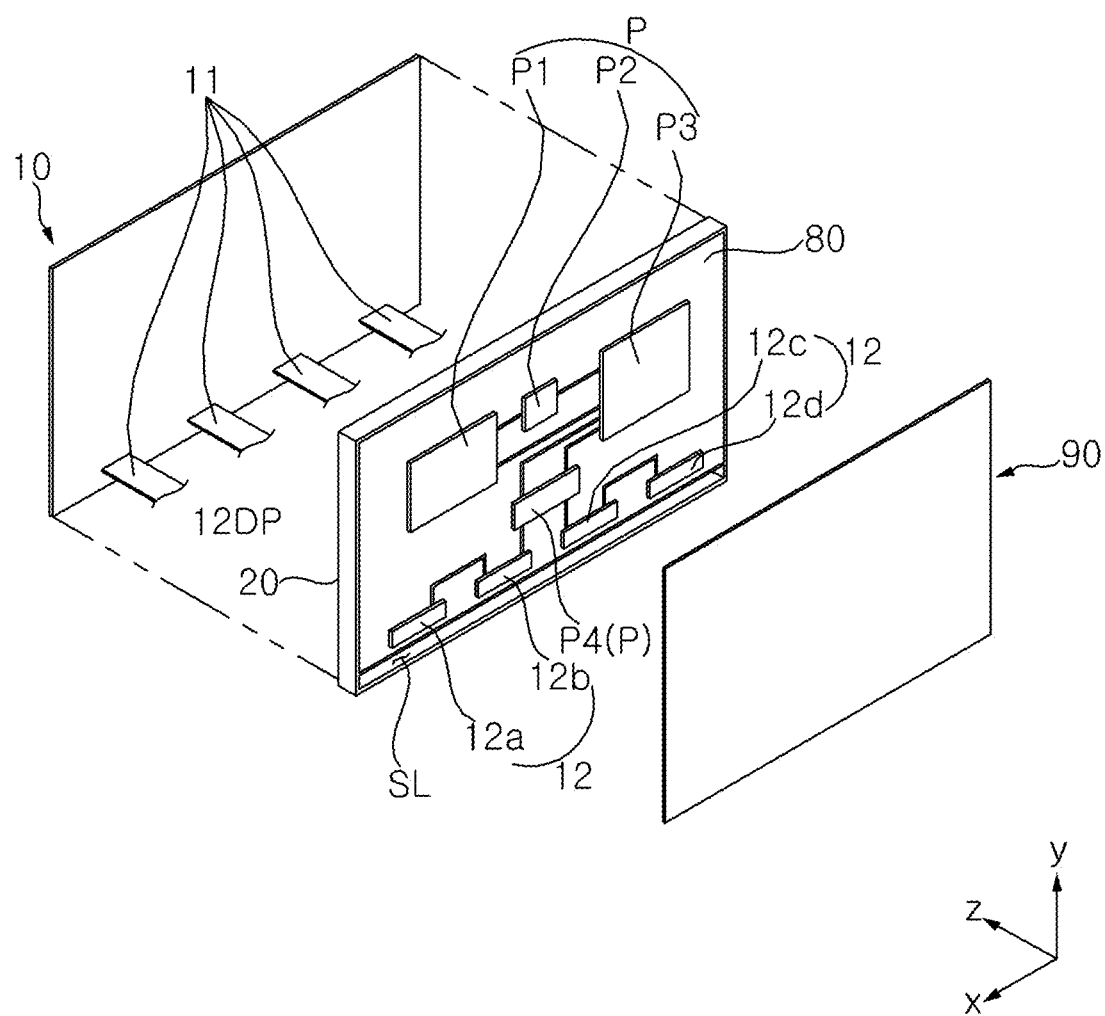

Referring to FIG. 11, a board P may be mounted on the frame 80. A plurality of electronic devices may be mounted on the board P. The board P may be a printed circuit board (PCB), and may be electrically connected to electronic components of the display device. A plurality of boards P may be coupled to the rear surface of the frame 80.

A power supply board P1 may supply power to each component of the display device. A Light Emitting Diode (LED) driver board P2 may be electrically connected to the power supply board Pl and a main board P3 through a cable, and provide power and current to a substrate on which light sources such as LED are mounted. A main board P3 may control each component of the display device. A timing controller board P4 may be connected to the main board P3 through a cable, and may provide an image signal to the display panel 10. For example, the power supply board P1 may be adjacent to the left side of the frame 80, and the main board P3 may be adjacent to the right side of the frame 80. The LED driver board P2 may be located between the power supply board P1 and the main board P3, and the timing controller board P4 may be located below the LED driver board P2.

The cable 11 may be electrically connected to the display panel 10 while being adjacent to the lower side of the display panel 10. The cable 11 may pass through a slit SL or hole formed in the frame 80. For example, the cable 11 may be a Chip On Film (COF).

A source PCB 12 may be coupled to the rear surface of the frame 80 while being adjacent to the lower side of the frame 80, and may be electrically connected to the cable 11. For example, a plurality of source PCBs 12a, 12b, 12c, and 12d may be spaced apart from each other along the lower side of the frame 80, and may be electrically connected to a plurality of cables 11. A second source PCB 12b may be electrically connected to a first source PCB 12a through a first bridge cable (no reference numeral). A third source PCB 12c may be electrically connected to a fourth source PCB 12d through a second bridge cable (no reference numeral). The second source PCB 12b and the third source PCB 12c may be electrically connected to the timing controller board P4 through connecting cables (no reference numeral). For example, the first and second bridge cables and the connecting cables may be a flexible flat cable (FFC).

Accordingly, the timing controller board P4 may provide digital video data and a timing control signal to the display panel 10 through the source PCB 12.

The back cover 90 may be located in the rear of the frame 80, and may be coupled to the frame 80. The board P may be located between the frame 80 and the back cover 90, and may be covered by the back cover 90.

Figure 12:
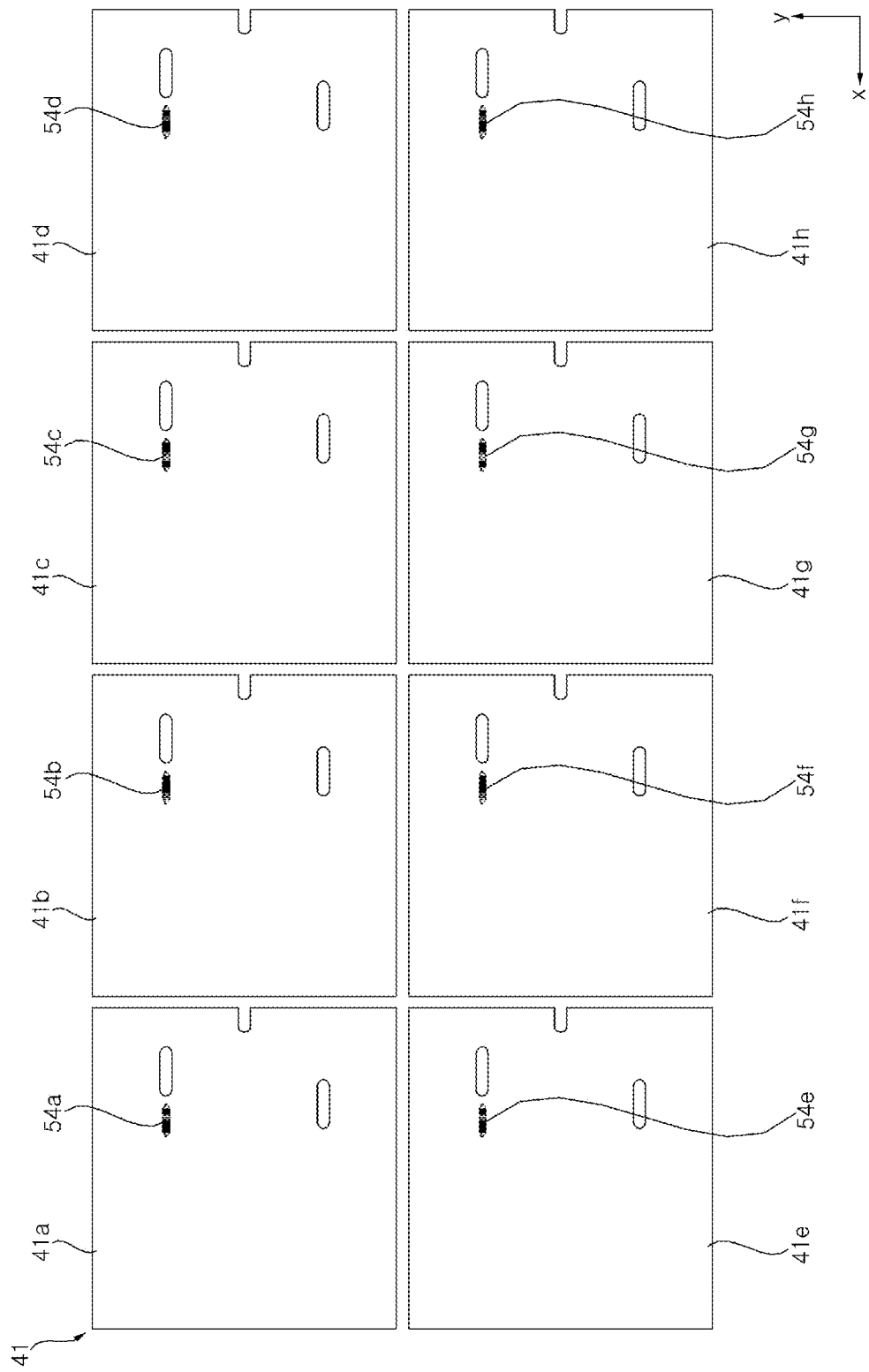
Figure 13:
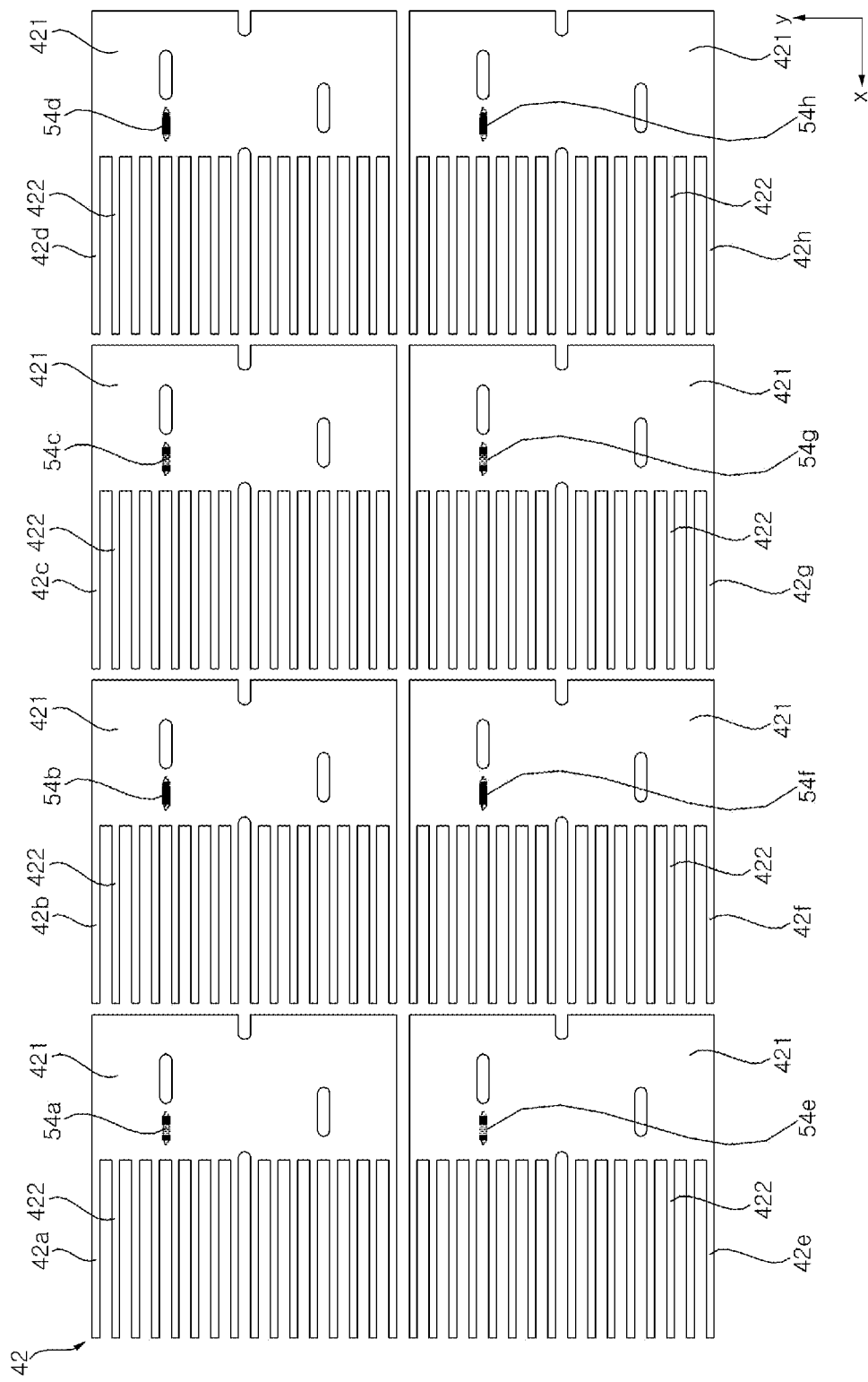

Referring to FIGS. 12 and 13, the plurality of connectors 54a, 54b, 54c, 54d, 54e, 54f, 54g, and 54h may be mounted on the rear surface of the plurality of substrates 41 and 42. The number of connectors 54a, 54b, 54c, 54d, 54e, 54f, 54g, and 54h may be the same as the number of substrates 41 and 42.

Referring to FIG. 12, each of the plurality of substrates 41a, 41b, 41c, 41d, 41e, 41g, and 41h may have a plate shape (see FIG. 5). A first connector 54a may be coupled to the rear surface of a first substrate 41a, and a second connector 54b may be coupled to the rear surface of a second substrate 41b. A third connector 54c may be coupled to the rear surface of a third substrate 41c, and a fourth connector 54d may be coupled to the rear surface of a fourth substrate 41d. A fifth connector 54e may be coupled to the rear surface of a fifth substrate 41e, and a sixth connector 54f may be coupled to the rear surface of a sixth substrate 41f. A seventh connector 54g may be coupled to the rear surface of a seventh substrate 41g, and an eighth connector 54h may be coupled to the rear surface of an eighth substrate 41h.

Referring to FIG. 13, each of the plurality of substrates 42a, 42b, 42c, 42d, 42e, 42f, 42g, and 42h may have a fork shape (see FIG. 9). The first connector 54a may be coupled to the rear surface of the body 421 of the first substrate 42a, and the second connector 54b may be coupled to the rear surface of the body 421 of the second substrate 42b. The third connector 54c may be coupled to the rear surface of the body 421 of the third board 42c, and the fourth connector 54d may be coupled to the rear surface of the body 421 of the fourth board 42d. The fifth connector 54e may be coupled to the rear surface of the body 421 of the fifth board 42e, and the sixth connector 54f may be coupled to the rear surface of the body 421 of the sixth board 42f. The seventh connector 54g may be coupled to the rear surface of the body 421 of the seventh board 42g, and the eighth connector 54h may be coupled to the rear surface of the body 421 of the eighth board 42h.

Figure 14:
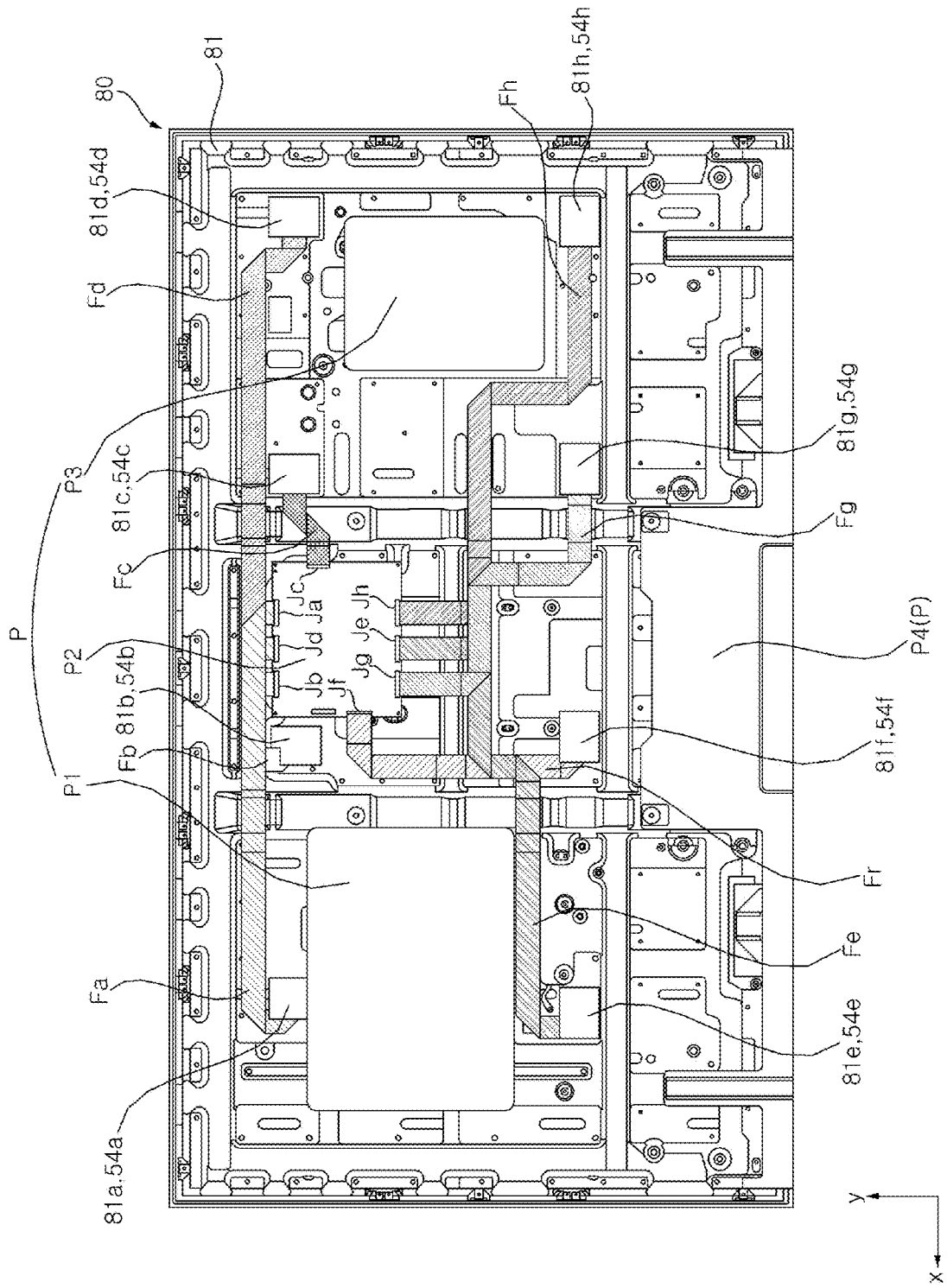

Referring to FIG. 14, the LED driver board P2 may be electrically connected to the connectors 54a, 54b, 54c, 54d, 54e, 54f, 54g, and 54h through cables Fa, Fb, Fc, Fd, Fe, Ff, Fg, and Fh. The cables Fa, Fb, Fc, Fd, Fe, Ff, Fg, and Fh may be a Flexible Flat Cable (FFC).

One end of a first cable Fa may be connected to a first connector Ja of the LED driver board P2, and the other end of the first cable Fa may be connected to the first connector 54a through a first frame hole 81a.

One end of a second cable Fb may be connected to a second connector Jb of the LED driver board P2, and the other end of the second cable Fb may be connected to the second connector 54b through a second frame hole 81b.

One end of a third cable Fc may be connected to a third connector Jc of the LED driver board P2, and the other end of the third cable Fc may be connected to the third connector 54c through a third frame hole 81c.

One end of a fourth cable Fd may be connected to a fourth connector Jd of the LED driver board P2, and the other end of the fourth cable Fd may be connected to the fourth connector 54d through a fourth frame hole 81d.

One end of a fifth cable Fe may be connected to a fifth connector Je of the LED driver board P2, and the other end of the fifth cable Fe may be connected to the fifth connector 54e through a fifth frame hole 81e.

One end of a sixth cable Ff may be connected to a sixth connector Jf of the LED driver board P2, and the other end of the sixth cable Ff may be connected to the sixth connector 54f through a sixth frame hole 81f.

One end of a seventh cable Fg may be connected to a seventh connector Jg of the LED driver board P2, and the other end of the seventh cable Fg may be connected to the seventh connector 54g through a seventh frame hole 81g.

One end of an eighth cable Fh may be connected to an eighth connector Jh of the LED driver board P2, and the other end of the eighth cable Fh may be connected to the eighth connector 54h through an eighth frame hole 81h.

That is, in order to connect the LED driver board P2 to the plurality of substrates (41, see FIG. 12; 42, see FIG. 13), the same number of cables Fa, Fb, Fc, Fd, Fe, Ff, Fg, Fh as the substrates 41 and 42 may be required. Due to such a large number of cables Fa, Fb, Fc, Fd, Fe, Ff, Fg, Fh, the manufacturing cost of the display device may be increased, and the connection structure of the LED driver board P2 and the substrates 41 and 42 may be complicated.

Figure 15:
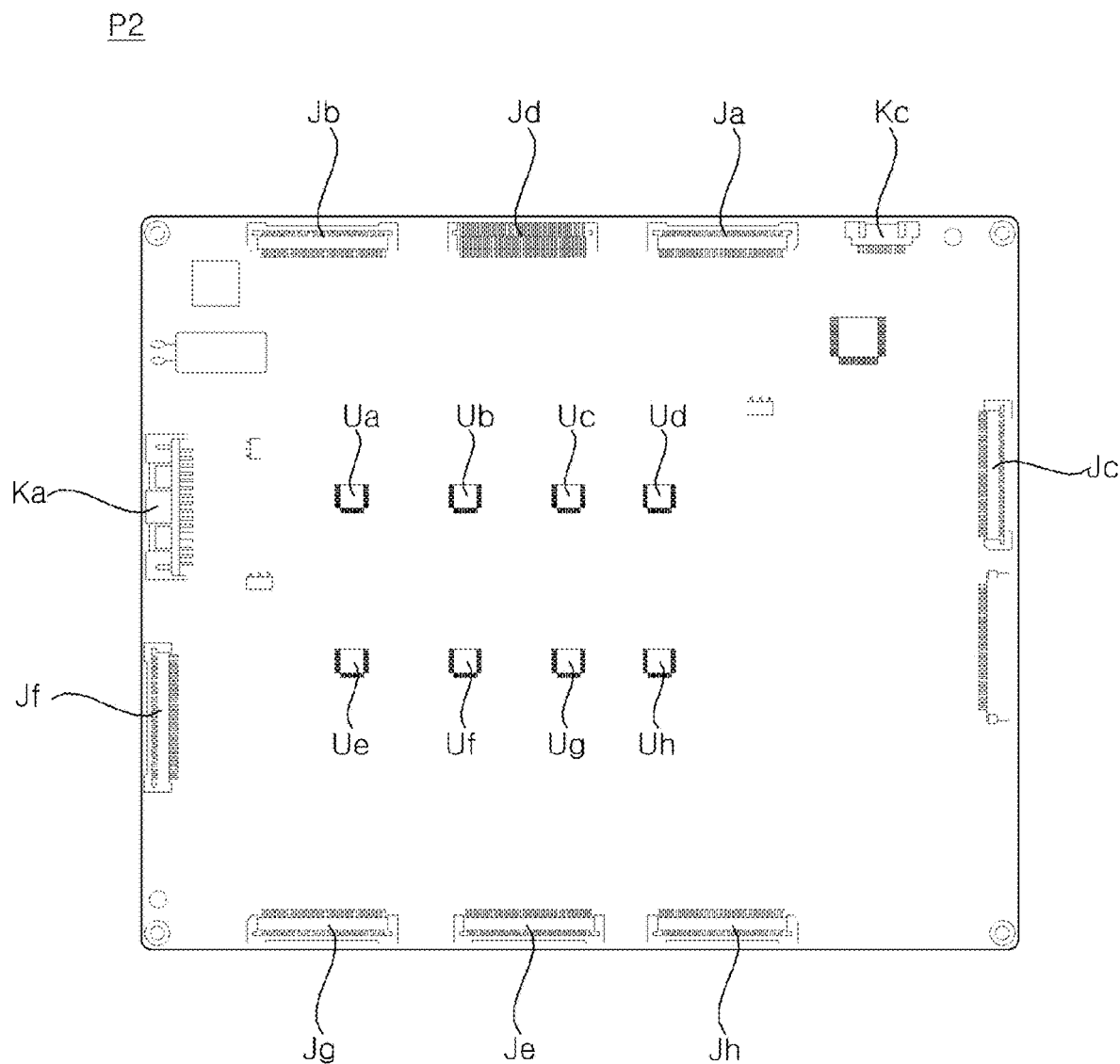
Figure 16:
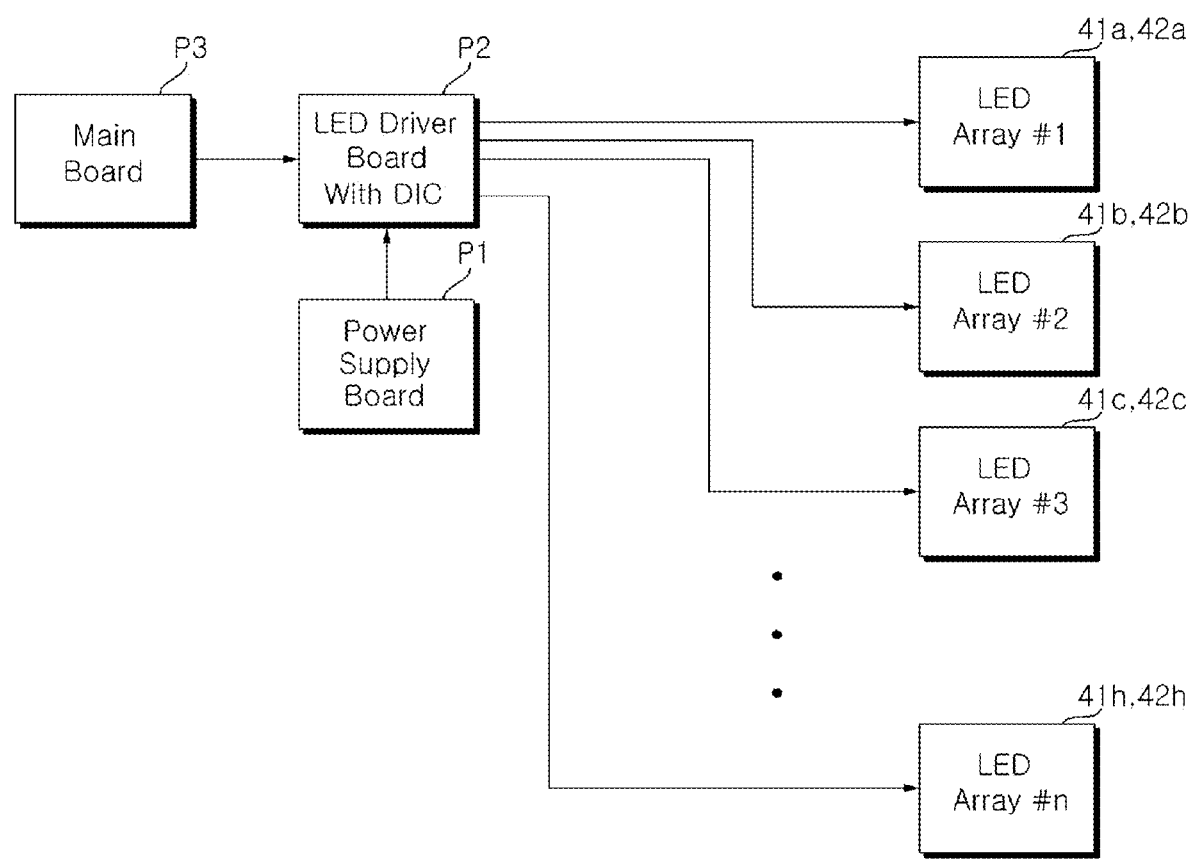
Figure 17:
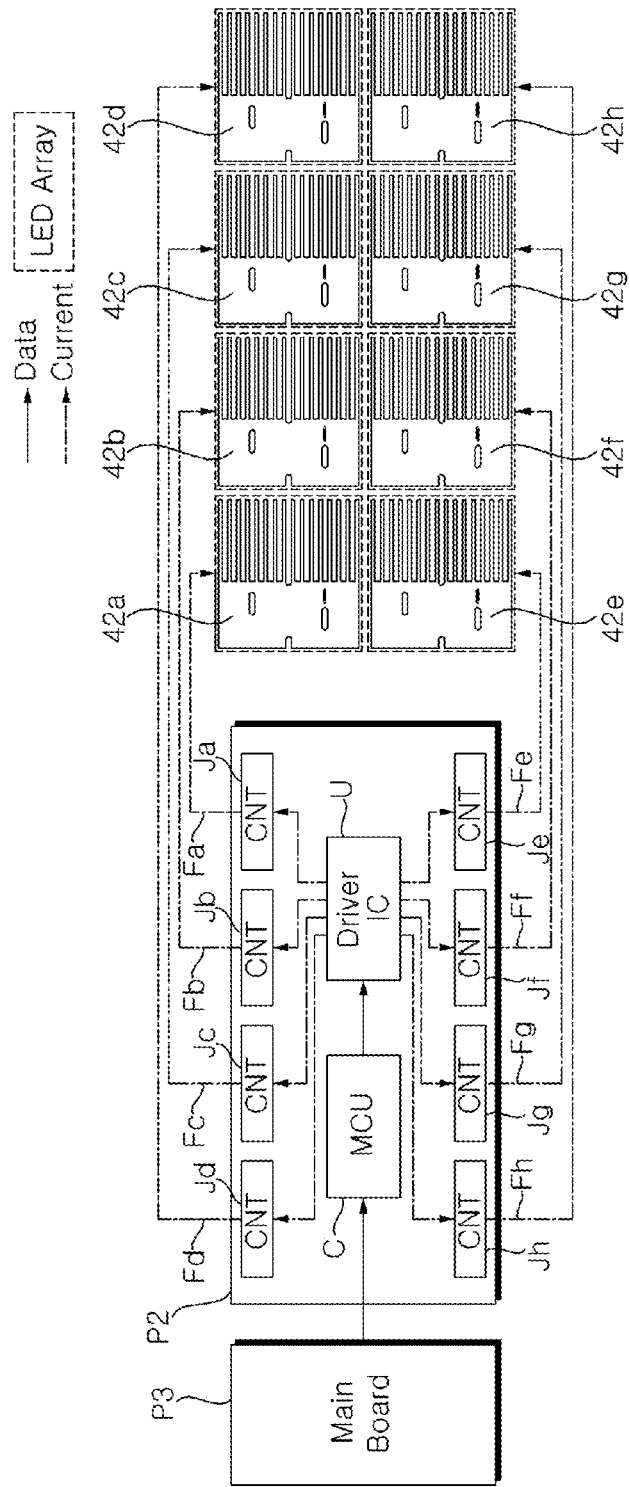

Referring to FIGS. 15 to 17, the LED driver board P2 may include a processor C, a power supply board connector Ka, a main board connector Kc, a plurality of connectors Ja, Jb, Jc, Jd, Je, Jf, Jg, Jh, and a plurality of driver Integrated Circuits (ICs) Ua, Ub, Uc, Ud, Ue, Uf, Ug, Uh.

The power supply board connector Ka may be electrically connected to the power supply board P1 through a cable (see FIG. 11). The main board connector Kc may be electrically connected to the main board P3 through a cable (see FIG. 11).

The processor C may be a Micro Controller Unit (MCU). The processor C may be referred to as a controller C. The processor C may convert (process) the data related to the image quality (e.g. brightness) of the light sources transmitted from the main board P3 and provide to a plurality of driver ICs Ua, Ub, Uc, Ud, Ue, Uf, Ug, Uh.

The plurality of driver ICs Ua, Ub, Uc, Ud, Ue, Uf, Ug, Uh may be electrically connected to a plurality of substrates (41, see FIG. 12; 42, see FIG. 13), based on the data transmitted from the processor C.

The number of a plurality of connectors Ja, Jb, Jc, Jd, Je, Jf, Jg, Jh and the number of the plurality of driver Integrated Circuits (ICs) Ua, Ub, Uc, Ud, Ue, Uf, Ug, Uh may be the same as the number of a plurality of substrates (41, see FIG. 12; 42, see FIG. 13). A driver IC may be referred to as a DIC, a driver chip, or a driver unit.

A first driver IC Ua may be electrically connected to the light sources (i.e., a first LED array) on the first substrate 41a, 42a through a first cable Fa (see FIG. 14) connecting the first connector Ja of the LED driver board P2 and the first connector 54a (see FIGS. 12 and 13) of the first substrate 41a, 42a.

A second driver IC Ub may be electrically connected to the light sources (i.e., a second LED array) on the second substrate 41b, 42b through a second cable Fb (see FIG. 14) connecting the second connector Jb of the LED driver board P2 and the second connector 54b (see FIGS. 12 and 13) of the second substrate 41b, 42b.

A third driver IC Uc may be electrically connected to the light sources (i.e., a third LED array) on the third substrate 41c and 42c, through a third cable Fc (see FIG. 14) connecting the third connector Jc of the LED driver board P2 and the third connector 54c (see FIGS. 12 and 13) of the third substrate 41c and 42c.

A fourth driver IC Ud may be electrically connected to the light sources (i.e. a fourth LED array) on the fourth substrate 41d and 42d, through a fourth cable Fd (see FIG. 14) connecting the fourth connector Jd of the LED driver board P2 and the fourth connector 54d (sec FIGS. 12 and 13) of the fourth substrate 41d and 42d.

A fifth driver IC Ue may be electrically connected to the light sources (i.e., a fifth LED array) on the fifth substrate 41e and 42e, through a fifth cable Fe (see FIG. 14) connecting the fifth connector Je of the LED driver board P2 and the fifth connector 54c (see FIGS. 12 and 13) of the fifth substrate 41e and 42c.

A sixth driver IC Uf may be electrically connected to the light sources (i.e., a sixth LED array) on the sixth substrate 41f and 42f through a sixth cable Ff (see FIG. 14) connecting the sixth connector Jf of the LED driver board P2 and the sixth connector 54f (see FIGS. 12 and 13) of the sixth substrate 41f and 42f.

A seventh driver IC Ug may be electrically connected to the light sources (i.e., a seventh LED array) on the seventh substrate 41g and 42g through a seventh cable Fg (sec FIG. 14) connecting the seventh connector Jg of the LED driver board P2 and the seventh connector 54g (see FIGS. 12 and 13) of the seventh substrate 41g and 42g.

An eighth driver IC Uh may be electrically connected to the light sources (i.e., an eighth LED array) on the eighth substrate 41h and 42h through an eighth cable Fh (sec FIG. 14) connecting the eighth connector Jh of the LED driver board P2 and the eighth connector 54h (sec FIGS. 12 and 13) of the eighth substrate 41h and 42h.

However, as a plurality of driver ICs Ua, Ub, Uc, Ud, Ue, Uf, Ug, Uh are disposed adjacent to each other, a driver IC capable of flowing a current of 30 mA can reach 78° C. when a current of 9.84 mA flows.

Figure 18:
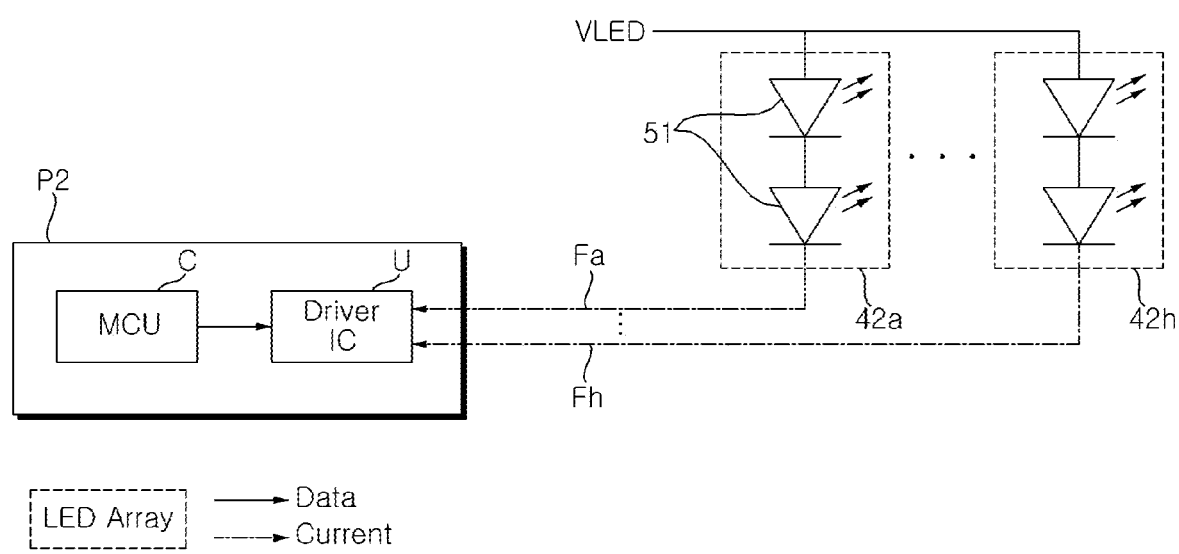
Figure 19:
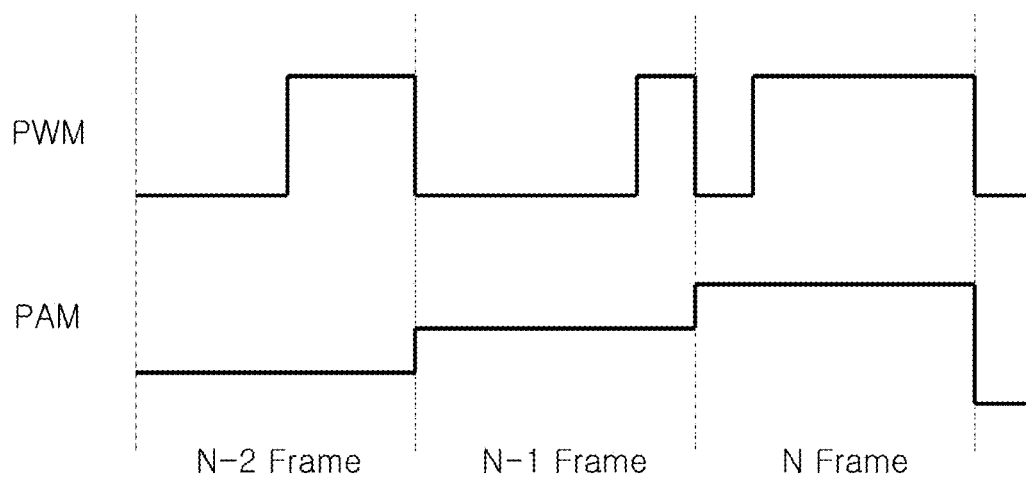

Referring to FIGS. 18 and 19, a power VLED may be provided from the power supply board P1 to the plurality of connectors 54a, 54b, 54c, 54d 54c, 54f, 54g, 54h (sec FIGS. 12 and 13) of the plurality of substrates (41a, 41b, 41c, 41d, 41e, 41f, 41g, 41h; 42a, 42b, 42c, 42d, 42e, 42f, 42g, 42h) through the LED driver board P2 and the plurality of cables Fa, Fb, Fc, Fd, Fe, Ff, Fg, Fh. The power VLED supplied to the plurality of connectors 54a, 54b, 54c, 54d, 54e, 54f, 54g, 54h may be provided to the light sources 51 of each of the plurality of substrates (41a, 41b, 41c, 41d, 41e, 41f, 41g, 41h; 42a, 42b, 42c, 42d, 42e, 42f, 42g, 42h). The current passed through the light sources 51 may flow to each of the plurality of driver Ics Ua, Ub, Uc, Ud, Ue, Uf, Ug, Uh (see FIG. 15) through each of the plurality of connectors 54a, 54b, 54c, 54d, 54c, 54f, 54g, 54h and each of the plurality of cables Fa, Fb, Fc, Fd, Fe, Ff, Fg, Fh.

The light sources 51 of each of the plurality of substrates (41a, 41b, 41c, 41d, 41e, 41f, 41g, 41h; 42a, 42b, 42c, 42d, 42e, 42f, 42g, 42h) may be grouped into a plurality of local dimming blocks. Each of the plurality of connectors 54a, 54b, 54c, 54d, 54e, 54f, 54g, and 54h may include a power pin to which power VLED is supplied and block pins connected to the local dimming blocks and the driver IC. The power pin may be electrically connected to each local dimming block through a circuit on the substrate, and the block pins may also be electrically connected to each local dimming block through a circuit on the substrate. The number of block pins may be the same as the number of local dimming blocks. The driver IC may adjust the amount of current flowing to the light sources 51 belonging to each local dimming block between the power pin and the block pins, or may block the flow of current, thereby adjusting the light sources 51 belonging to each local dimming block, and as a result, implementing local dimming.

Such local dimming may be driven while current flows through a plurality of cables Fa, Fb, Fc, Fd, Fe, Ff, Fg, Fh in a Pulse Width Modulation (PWM) or Pulse Amplitude Modulation (PAM) method.

Figure 20:
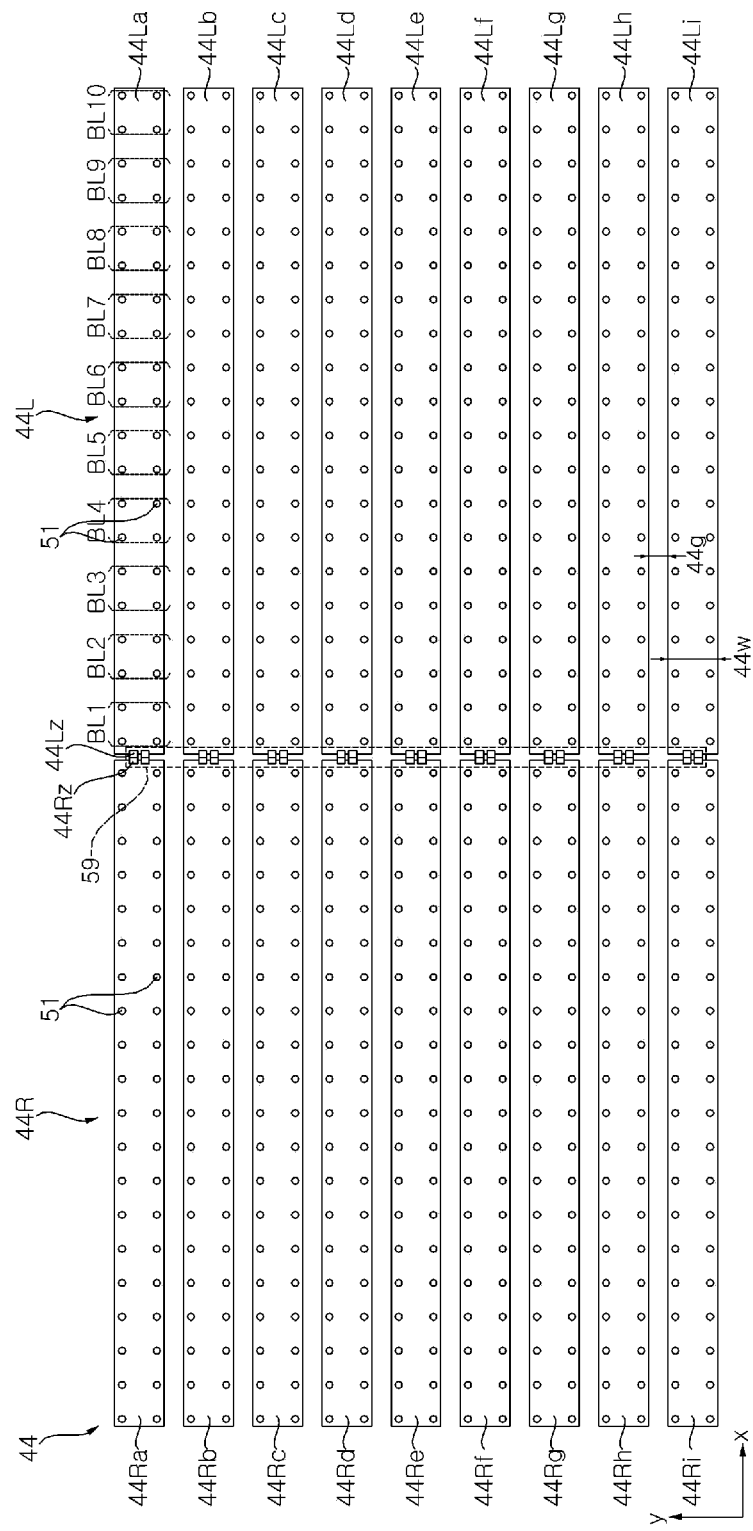
Figure 21:
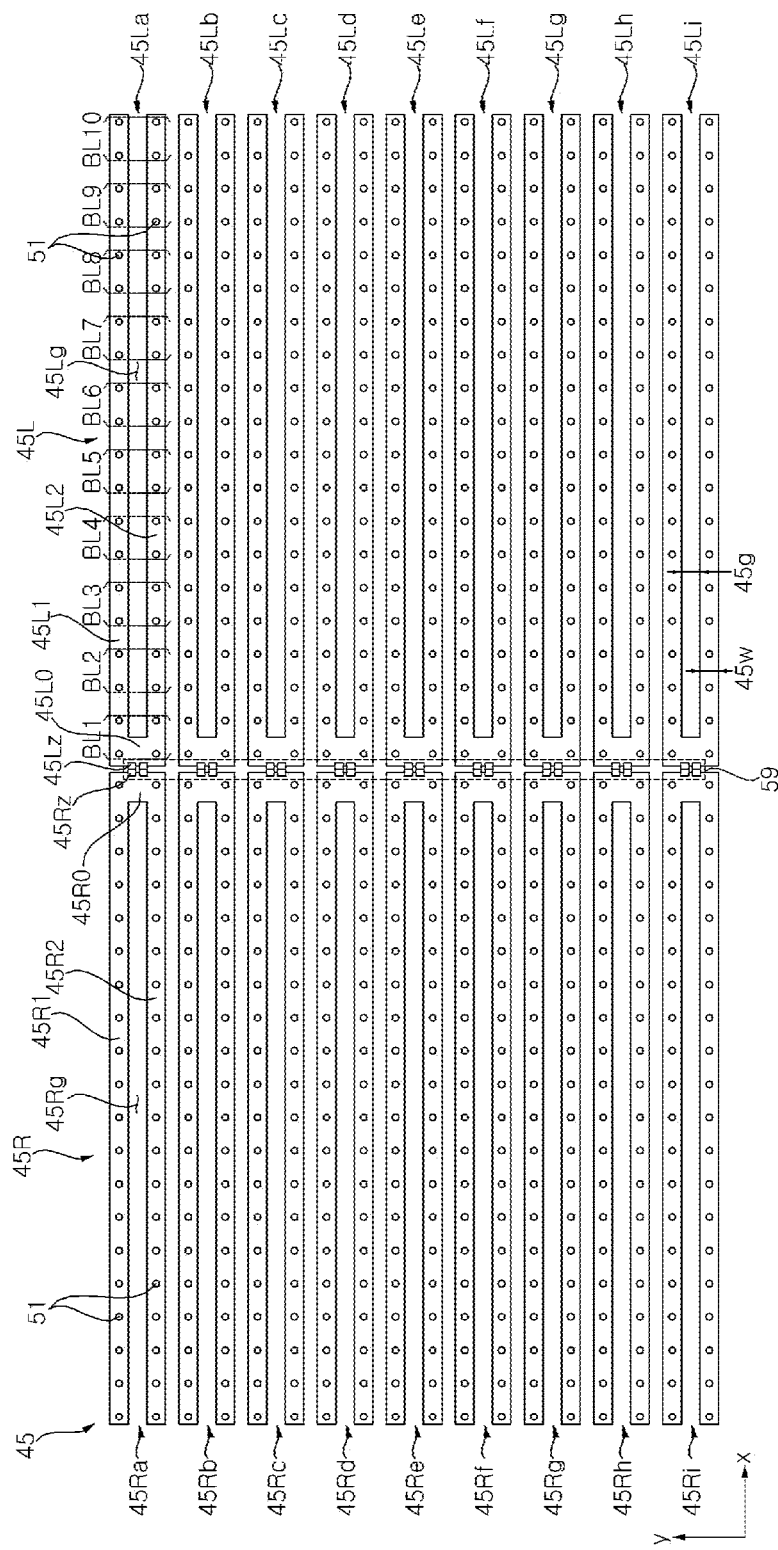
Figure 22:
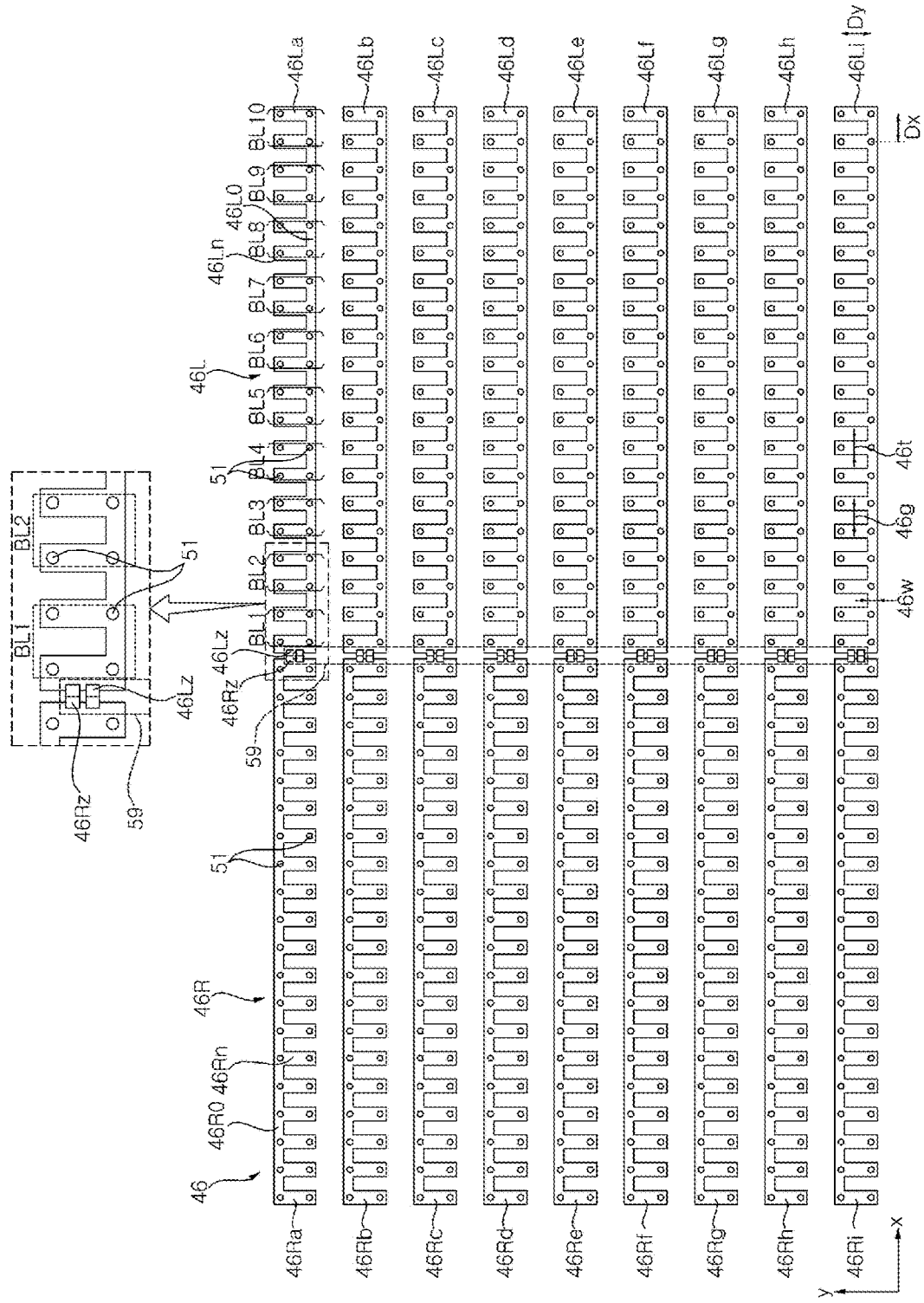

Referring to FIGS. 20 to 22, substrates 44, 45, 46 may be coupled to the front surface of the frame 80 or the front surface of the heat dissipation plate 83. The substrate 44, 45, 46 may be a printed circuit board (PCB). For example, the substrate 44, 45, 46 may include at least one of polyethylene terephthalate (PET), glass, polycarbonate (PC), or silicon.

Referring to FIG. 20, the substrate 44 may have a bar shape. Each of the plurality of substrates 44 may be elongated. The plurality of substrates 44 may be spaced apart from each other in a direction perpendicular to the length direction of the substrate 44. The length direction of the substrate 44 may be defined in a horizontal direction.

An extension board 59 may extend in a direction (e.g., a vertical direction) in which the substrates 44 are spaced apart from each other. For example, the plurality of substrates 44 may extend from one long side of the extension board 59 in a direction (e.g., a horizontal direction) intersecting the extension board 59. For another example, the plurality of substrates 44 may include a plurality of first substrates 44L and a plurality of second substrates 44R that are opposite to each other with respect to the extension board 59. The plurality of first substrates 44L and the plurality of second substrates 44R may be aligned with each other in the length direction of the substrate 44 or may be staggered with each other. The plurality of first substrates 44L and the plurality of second substrates 44R may have the same shape.

The plurality of first substrates 44La, 44Lb, 44Lc, 44Ld, 44Le, 44Lf, 44Lg, 44Lh, 44Li may be electrically connected to the extension board 59 while being adjacent to a first long side (e.g., left side) of the extension board 59 through the plurality of first connectors 44Lz.

The plurality of second substrates 44Ra, 44Rb, 44Rc, 44Rd, 44Rc, 44Rf, 44Rg, 44Rh, 44Ri may be electrically connected to the extension board 59 while being adjacent to a second long side (e.g., right side) of the extension board 59 through the plurality of second connectors 44Rz.

The plurality of light sources 51 may be arranged in a matrix form on the front surface of the plurality of substrates 44. The reflective sheet(s) 60 (see FIG. 2) may have a hole 601 (sec FIG. 2) in which light sources 51 or a lens covering the light sources 51 is located.

For example, forty light sources 51 may be arranged in two or three or more lines on the first substrate 44La, and two lines of light sources 51 may be paired by N numbers and grouped into a local dimming block. Here, N is an even number greater than or equal to 2, and when two lines of light sources 51 are paired with four and grouped into a local dimming block, the number of the local dimming blocks BL1, BL2, BL3, BL4, BL5, BL6, BL7, BL8, BL9, BL10 is 10. The local dimming blocks of the first substrate 44La may be configured independently of the local dimming blocks of each of the remaining first substrates 44Lb, 44Lc, 44Ld, 44Le, 44Lf, 44Lg, 44Lh, 44Li, and may also be configured independently of the local dimming blocks of each of the plurality of second substrates 44Ra, 44Rb, 44Rc, 44Rd, 44Re, 44Rf, 44Rg, 44Rh, 44Ri.

Referring to FIG. 21, the substrate 45 may have a shape of tongs, a tuning fork, or a chain.

The substrate 45 may include a body 45L0, 45R0 and a plurality of legs (45L1, 45L2; 45R1, 45R2). The body 45L0, 45R0 may be elongated. The plurality of legs (45L1 and 45L2; 45R1 and 45R2) may be a pair of legs (45L1 and 45L2; 45R1 and 45R2). The pair of legs (45L1, 45L2; 45R1, 45R2) may extend from one long side of the body 45L0, 45R0 in a direction intersecting the body 45L0, 45R0, and may be spaced apart from each other in the length direction of the body 45L0, 45R0. The length direction of the body 45L0, 45R0 may be defined in a vertical direction, and the length direction of the pair of legs (45L1, 45L2; 45R1, 45R2) may be defined in a horizontal direction. The length of the pair of legs (45L1, 45L2; 45R1, 45R2) may be greater than the length of the body 45L0, 45R0.

The length direction of the plurality of substrates 45 may be the same as the length direction of the pair of legs (45L1, 45L2; 45R1, 45R2). The plurality of substrates 45 may be spaced apart from each other in a direction perpendicular to the length direction of the substrate 45.

The extension board 59 may extend in a direction (e.g., a vertical direction) in which the substrates 45 are spaced apart from each other. For example, the plurality of substrates 45 may extend from one long side of the extension board 59 in a direction (e.g., a horizontal direction) intersecting the extension board 59. For another example, the plurality of substrates 45 may include a plurality of first substrates 45L and a plurality of second substrates 45R that are opposite to each other with respect to the extension board 59. The plurality of first substrates 45L and the plurality of second substrates 45R may be aligned with each other in the length direction of the substrate 45 or may be staggered with each other. The plurality of first substrates 45L and the plurality of second substrates 45R may have the same shape.

The plurality of first substrates 45La, 45Lb, 45Lc, 45Ld, 45Le, 45Lf, 45Lg, 45Lh, and 45Li may be electrically connected to the extension board 59 through the plurality of first connectors 45Lz while being adjacent to the first long side (e.g., the left side) of the extension board 59.

The plurality of second substrates 45Ra, 45Rb, 45Rc, 45Rd, 45Re, 45Rf, 45Rg, 45Rh, and 45Ri may be electrically connected to the extension board 59 through the plurality of second connectors 45Rz while being adjacent to the second long side (e.g., right side) of the extension board 59.

The plurality of light sources 51 may be arranged in a matrix form on the front surface of the plurality of substrates 45. The reflective sheet(s) 60 (see FIG. 2) may have a hole 601 (see FIG. 2) in which light sources 51 or a lens covering the light sources 51 is located.

For example, forty light sources 51 may be arranged in several lines as many as the number of legs 45L1 and 45L2 along the plurality of legs 45L1 and 45L2 of the first substrate 45La, and the light sources 51 may be paired by N numbers and grouped into a local dimming block.

Here, N is an even number greater than or equal to 2, and when two lines of light sources 51 are paired with four and grouped into a local dimming block, the number of the local dimming blocks BL1, BL2, BL3, BL4, BL5, BL6, BL7, BL8, BL9, BL10 is 10.

The local dimming blocks of the first substrate 45La may be configured independently of the local dimming blocks of each of the remaining first substrates 45Lb, 45Lc, 45Ld, 45Le, 45Lf, 45Lg, 45Lh, 45Li, and may be configured independently of local dimming blocks of each of the plurality of second substrates 45Ra, 45Rb, 45Rc, 45Rd, 45Rc, 45Rf, 45Rg, 45Rh, and 45Ri.

Referring to FIG. 22, the substrate 46 may have a shape of a comb or saw blade.

The substrate 46 may include a body 46L0, 46R0 and a plurality of legs 46Ln, 46Rn. The body 46L0, 46R0 may be elongated. The plurality of legs 46Ln, 46Rn may extend from one long side of the body 46L0, 46R0 in a direction intersecting the body 46L0, 46R0, and be spaced apart from each other in the length direction of the body 46L0, 46R0. The length direction of the body 46L0, 46R0 may be defined in a horizontal direction, and the length direction of the plurality of legs 46Ln, 46Rn may be defined in a vertical direction. The length of the plurality of legs 46Ln, 46Rn may be smaller than the length of the body 46L0, 46R0. The body 46L0, 46R0 may be referred to as a base 46L0, 46R0, and the legs 46Ln, 46Rn may be referred to as a protrusion 46Ln, 46Rn.

The length direction of the plurality of substrates 46 may be the same as the length direction of the body 46L0, 46R0. The plurality of substrates 46 may be spaced apart from each other in a direction perpendicular to the length direction of the substrate 46.

The extension board 59 may extend in a direction (e.g., a vertical direction) in which the substrates 46 are spaced apart from each other. For example, the plurality of substrates 46 may extend from one long side of the extension board 59 in a direction (e.g., a horizontal direction) intersecting the extension board 59. For another example, the plurality of substrates 46 may include a plurality of first substrates 46L and a plurality of second substrates 46R that are opposite to each other with respect to the extension board 59. The plurality of first substrates 46L and the plurality of second substrates 46R may be aligned with each other in the length direction of the substrate 46 or may be staggered with each other. The plurality of first substrates 46L and the plurality of second substrates 46R may have the same shape.

The plurality of first substrates 46La, 46Lb, 46Lc, 46Ld, 46Lc, 46Lf, 46Lg, 46Lh, and 46Li may be electrically connected to the extension board 59 while being adjacent to the first long side (e.g., left side) of the extension board 59 through the plurality of first connectors 46Lz.

The plurality of second substrates 46Ra, 46Rb, 46Rc, 46Rd, 46Rc, 46Rf, 46Rg, 46Rh, and 46Ri may be electrically connected to the extension board 59 while being adjacent to the second long side (e.g., right side) of the extension board 59 through the plurality of second connectors 46Rz.

The plurality of light sources 51 may be arranged in a matrix form on the front surface of the plurality of substrates 46. The reflective sheet(s) 60 (see FIG. 2) may have a hole 601 (see FIG. 2) in which light sources 51 or a lens covering the light sources 51 is located.

For example, forty light sources 51 may be arranged in two or three or more lines along the first substrate 46La, and the two lines of light sources 51 may be paired by N and grouped into a local dimming block.

Here, N is an even number greater than or equal to 2, and when two lines of light sources 51 are paired by four and grouped into a local dimming block, the number of the local dimming blocks BL1, BL2, BL3, BL4, BL5, BL6, BL7, BL8, BL9, BL10 is 10.

The local dimming blocks of the first substrate 46La may be configured independently of the local dimming blocks of each of the remaining first substrates 46Lb, 46Lc, 46Ld, 46Lc, 46Lf, 46Lg, 46Lh, and 46Li, and may be configured independently of local dimming blocks of each of the plurality of second substrates 46Ra, 46Rb, 46Rc, 46Rd, 46Rc, 46Rf, 46Rg, 46Rh, and 46Ri.

Figure 23:
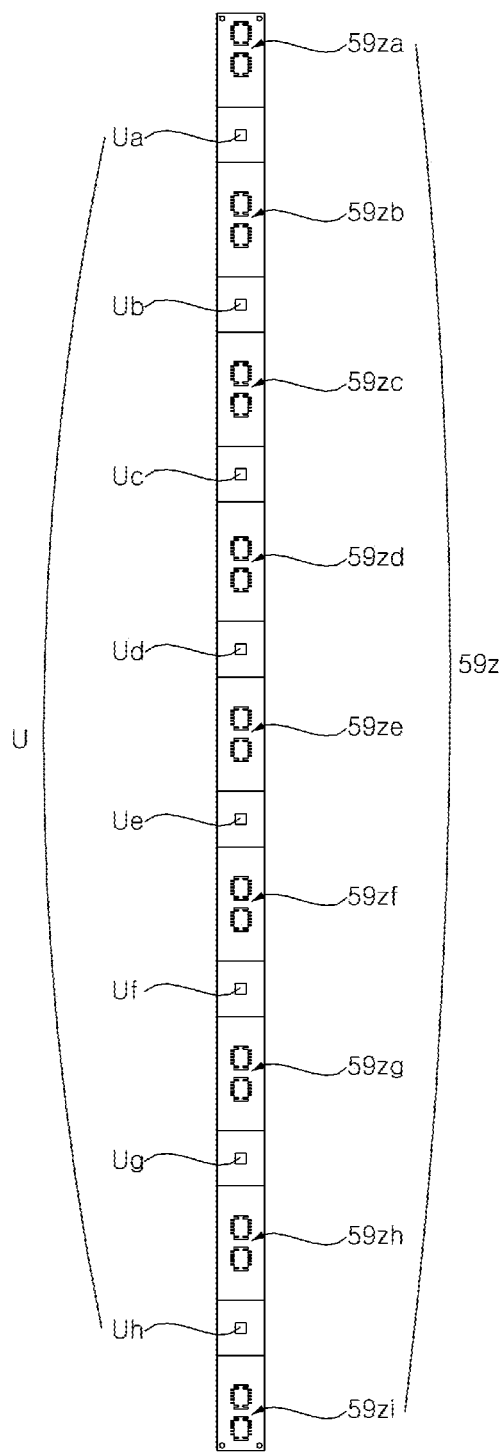

Referring to FIG. 23, the extension board 59 may be an elongated bar type PCB. The extension board 59 may include a plurality of mounting connectors 59z and a plurality of driver Integrated Circuits (Ics) U. A plurality of mounting connectors 59z may be attached to the extension board 59 through a Surface Mounter Technology SMT.

The mounting connector 59z may be referred to as a connector 59z or a central connector 59z, and the driver IC(U) may be referred to as a DIC (U), a driver chip (U) or a driver unit.

In the length direction of the extension board 59, a plurality of mounting connectors 59za, 59zb, 59zc, 59zd, 59ze, 59zf, 59zg, 59zh, 59zi and a plurality of driver ICs Ua, Ub, Uc, Ud, Ue, Uf, Ug, Uh may be alternately disposed.

For example, in the length direction of the extension board 59, a distance between the plurality of driver ICs Ua, Ub, Uc, Ud, Ue, Uf, Ug, Uh may be about 90 mm.

At this time, as the plurality of driver ICs Ua, Ub, Uc, Ud, Ue, Uf, Ug, Uh are distributed and disposed, the driver IC in which a current of 30 mA can flow may reach 78° C. when a current 14 mA flows.

That is, the driver IC (see FIG. 23) of the extension board 59 may dissipate heat relatively better than the driver IC (see FIG. 15) of the LED driver board P2. As a result, at the same temperature, the current flowing in the driver IC of the extension board 59 may be greater by 142% than the current flowing in the driver IC of the LED driver board P2.

Each of the above described first connectors (44Lz, see FIG. 20; 45Lz, see FIG. 21; 46Lz, see FIG. 22) and each of the above described second connectors (44Rz, sec FIG. 20; 45Rz, sec FIG. 21; 46Rz, see FIG. 22) may be connected to each of the mounting connectors 59ZA, 59ZB, 59ZC, 59ZD, 59ZE, 59ZF, 59ZG, 59ZH, 59ZI. Hereinafter, for brief description, a following description will be made based on the first connectors 46Lz (see FIG. 22) and the second connectors 46Rz (see FIG. 22).

Figure 24:
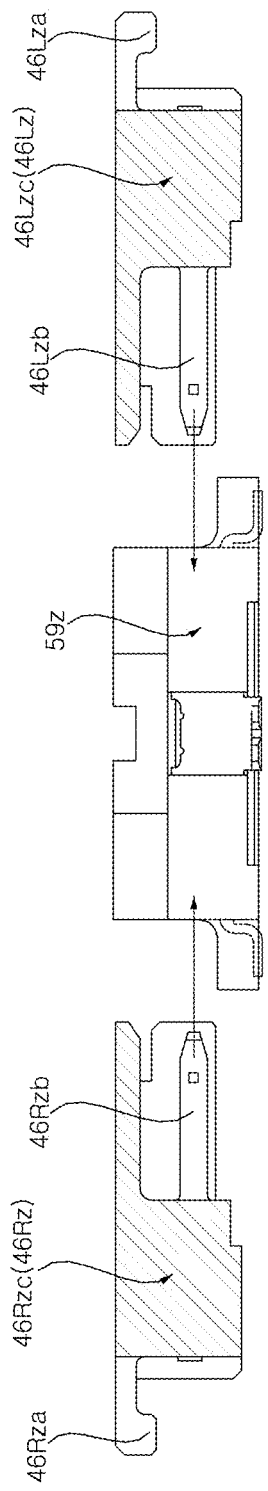
Figure 25:
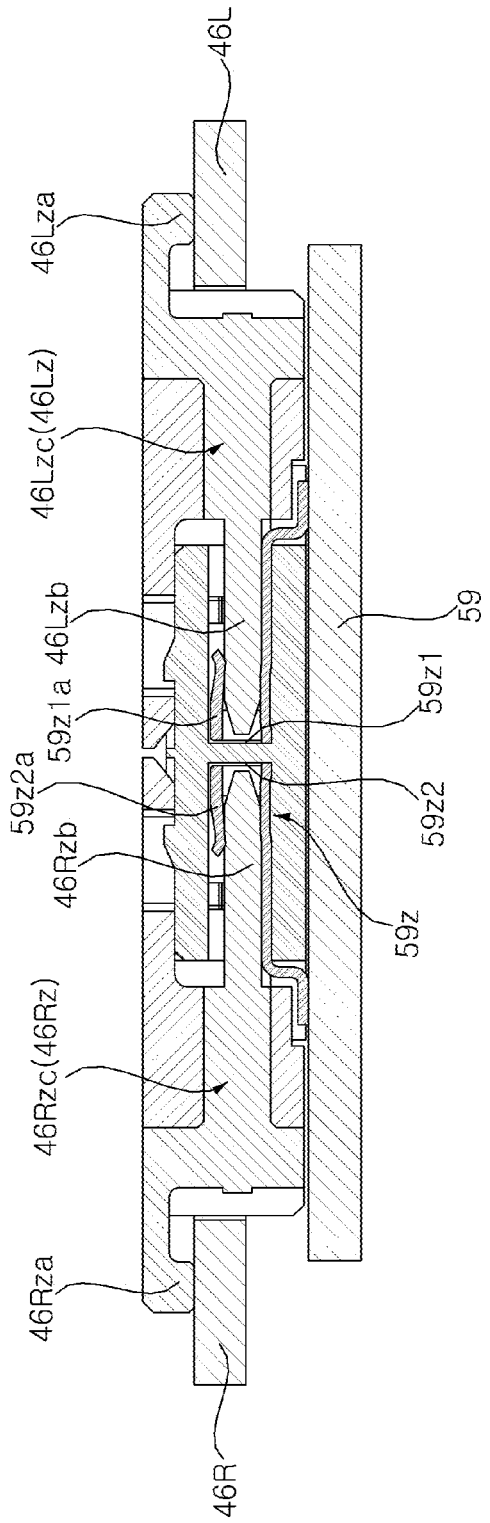

Referring to FIGS. 24 and 25, the first connector 46Lz and the second connector 46Rz may be opposite to each other with respect to the mounting connector 59z.

The first connector 46Lz may include a first body 46Lzc, a first coupling portion 46Lza, and a first pin 46Lzb. The first body 46Lzc may be located between the first substrate 46L and the mounting connector 59z. The first coupling portion 46Lza may protrude from the first body 46Lzc toward the first substrate 46L, and may be coupled to the first substrate 46L. The first coupling portion 46Lza may be attached on the first substrate 46L through a Surface Mounter Technology SMT. The first pin 46Lzb may protrude toward the mounting connector 59z from the first body 46Lzc. A first terminal 59z1a having elasticity may be located in a first groove 59z1 of the mounting connector 59z, and the width of the opening of the first terminal 59z1a before the first pin 46Lzb is inserted into the first groove 59z1 may be smaller than the diameter of the first pin 46Lzb. The first pin 46Lzb may be inserted into the first groove 59z1 through the opening of the first terminal 59z1a. The first terminal 59z1a may be in contact with the surface of the first pin 46Lzb inserted into the first groove 59z1, and may hold the first pin 46Lzb. The first connector 46Lz may be electrically connected to the first substrate 46L through the first coupling portion 46Lza, and may be electrically connected to the mounting connector 59z through the first pin 46Lzb.

The second connector 46Rz may include a second body 46Rzc, a second coupling portion 46Rza, and a second pin 46Rzb. The second body 46Rzc may be located between the second substrate 46R and the mounting connector 59z. The second coupling portion 46Rza may protrude from the second body 46Rzc toward the second substrate 46R, and may be coupled to the second substrate 46R. The second coupling portion 46Rza may be attached on the second substrate 46R through the Surface Mounter Technology SMT. The second pin 46Rzb may protrude from the second body 46Rzc toward the mounting connector 59z. The second terminal 59z2a having elasticity may be located in the second groove 59z2 of the mounting connector 59z, and the width of the opening of the second terminal 59z2a before the second pin 46Rzb is inserted into the second groove 59z2 may be smaller than the diameter of the second pin 46Rzb. The second pin 46Rzb may be inserted into the second groove 59z2 through the opening of the second terminal 59z2a. The second terminal 59z2a may be in contact with the surface of the second pin 46Rzb inserted into the second groove 59z2, and may hold the second pin 46Rzb. The second terminal 59z2a may be electrically connected to the second pin 46Rzb. The second connector 46Rz may be electrically connected to the second substrate 46R through the second coupling portion 46Rza, and may be electrically connected to the mounting connector 59z through the second pin 46Rzb.

Accordingly, the extension board 59 may be electrically connected to the first and second substrates 46L and 46R through the mounting connector 59z and the first and second connectors 46Lz and 46Rz.

Meanwhile, the first and second connectors 46Lz and 46Rz may be elevated from the first and second substrates 46L and 46R to form a step. The reflective sheet 60 may include cutting lines (see CLb in FIG. 8) that correspond to the first and second connectors 46Lz, 46Rz and are widened by the first and second connectors 46Lz, 46Rz. In this case, the reflective sheet 60 may be closer to the first and second substrates 46L, 46R, and a decrease in the distance between the reflective sheet 60 and the diffusion plate 31 (see FIG. 2) in the vicinity of the first and second connectors 46Lz and 46Rz may be minimized.

Figure 26:
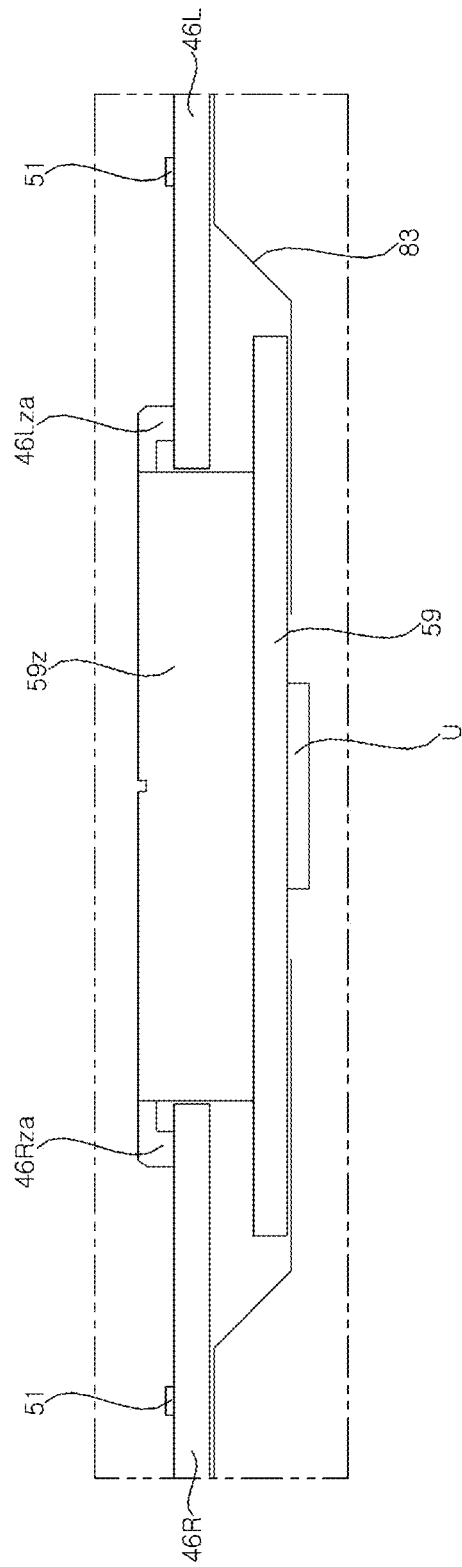

Referring to FIG. 26, the first and second substrates 46L and 46R may be a single sided PCB. The single sided PCB may be referred to as a 1-layer PCB or single layer PCB. The light sources 51 may be mounted on the upper surface of the first and second substrates 46L and 46R. In this case, the first and second substrates 46L and 46R may be a Metal Core PCB (MCPCB) having a metal material such as aluminum or copper as a core, and may have excellent heat dissipation performance. For example, the extension board 59 may be a single sided PCB, and the mounting connector 59z and the driver IC (U) may be mounted on the upper surface of the extension board 59. The single sided PCB may be referred to as a 1-layer PCB or single layer PCB. In this case, the extension board 59 may be a metal core PCB (MCPCB) having a metal material such as aluminum or copper as a core, and may have excellent heat dissipation performance. As another example, the extension board 59 may be a double sided PCB, the mounting connector 59z may be mounted on the upper surface of the extension board 59, and the driver IC (U) may be mounted on the upper or lower surface of the extension board 59. The double sided PCB may be referred to as a 2-layer PCB or double layer PCB. The driver IC(U) mounted on the lower surface of the extension board 59 may be located in a hole (no reference numeral) of the heat dissipation plate 83, and heat of the driver IC (U) may be effectively removed. As another example, the extension board 59 may be a multilayer PCB.

Figure 27:
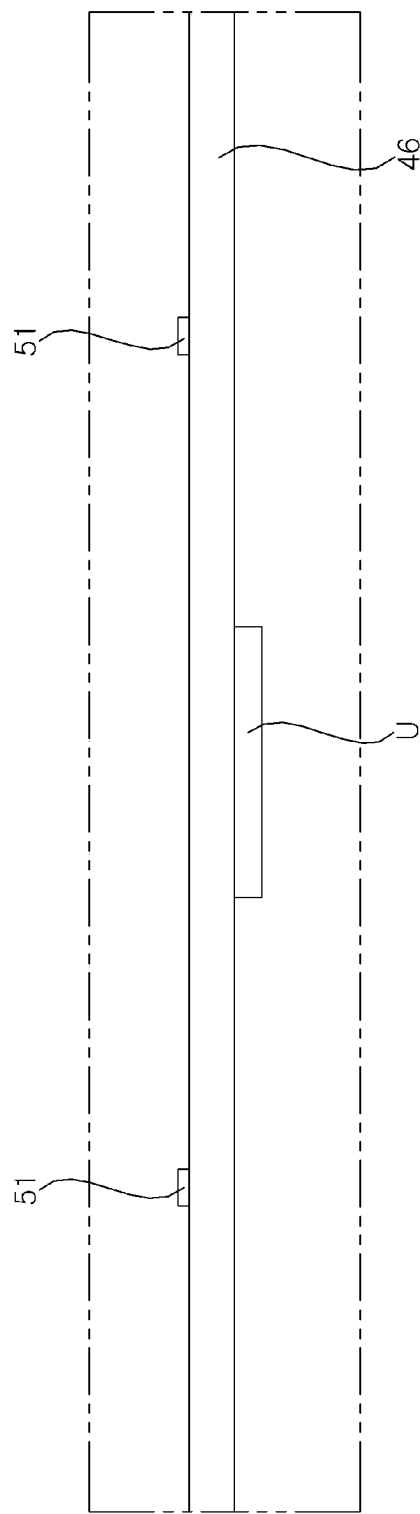

Referring to FIG. 27, unlike the above, the extension board 59 may be omitted, and the substrate 46 may be a double sided PCB. The double sided PCB may be referred to as a 2-layer PCB or double layer PCB. The light sources 51 may be mounted on the upper surface of the substrate 46. The driver IC (U) may be mounted on the upper or lower surface of the substrate 46. The double sided PCB may be more expensive than the single sided PCB. Alternatively, the extension board 59 may be omitted, the substrate 46 may be a single sided PCB, and the light sources 51 and the driver IC (U) may be mounted on the upper surface of the substrate 46. The single sided PCB may be referred to as a 1-layer PCB or single layer PCB. In this case, the remaining area on the substrate 46 excluding the light sources 51 and the driver IC (U) may be formed relatively large and may be wasted.

Figure 28:
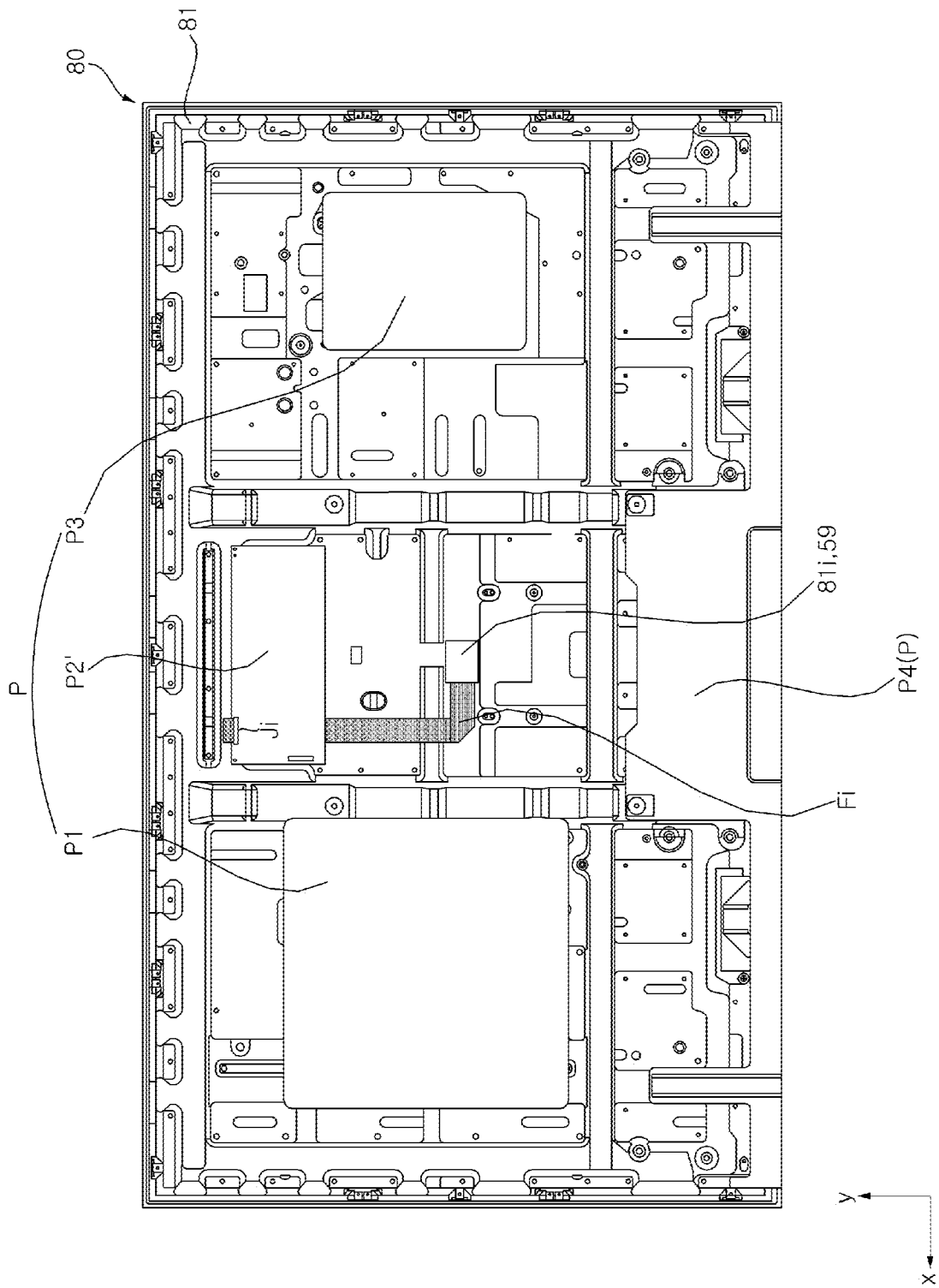

Referring to FIG. 28, a LED driver board P2' may be connected to the extension board 59 through a cable Fi. A cable Fi connected to a connector Ji of the LED driver board P2' may be connected to a connector of the extension board 59 (see FIGS. 20 to 23) through a hole 81i formed in the flat portion 81 of the frame 80. The number of cables Fi may be the same as the number of extension boards 59. One cable Fi may be connected to one extension board 59. The cable Fi may be a flexible flat cable (FFC). Alternatively, two or more cables Fi may be connected to two or more extension boards 59.

Accordingly, the LED driver board P2' may be simply electrically connected to the plurality of substrates (44, see FIG. 20; 45, see FIG. 21; 46, see FIG. 22) through the cable Fi and the extension board 59. Connectivity of the LED driver board P2' may be extended to a plurality of substrate 44, 45, 46 through the extension board 59.

Figure 29:
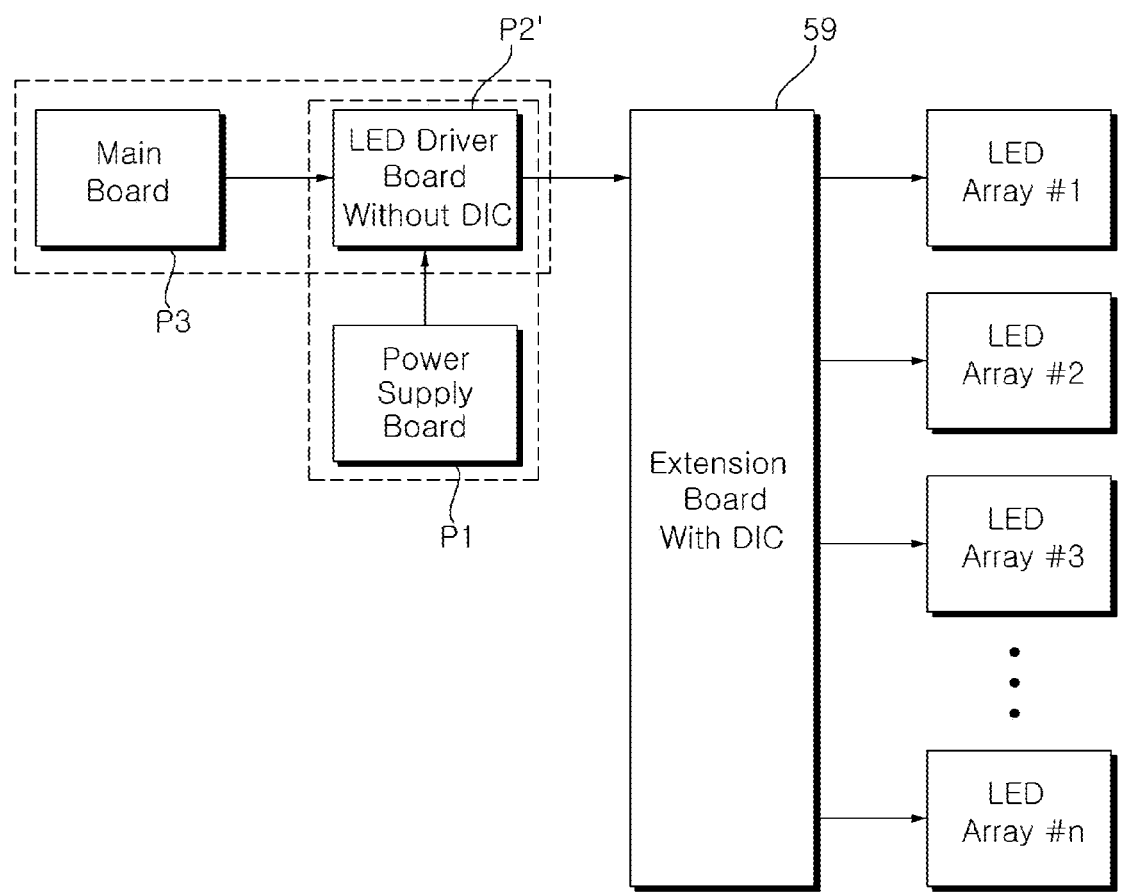
Figure 30:
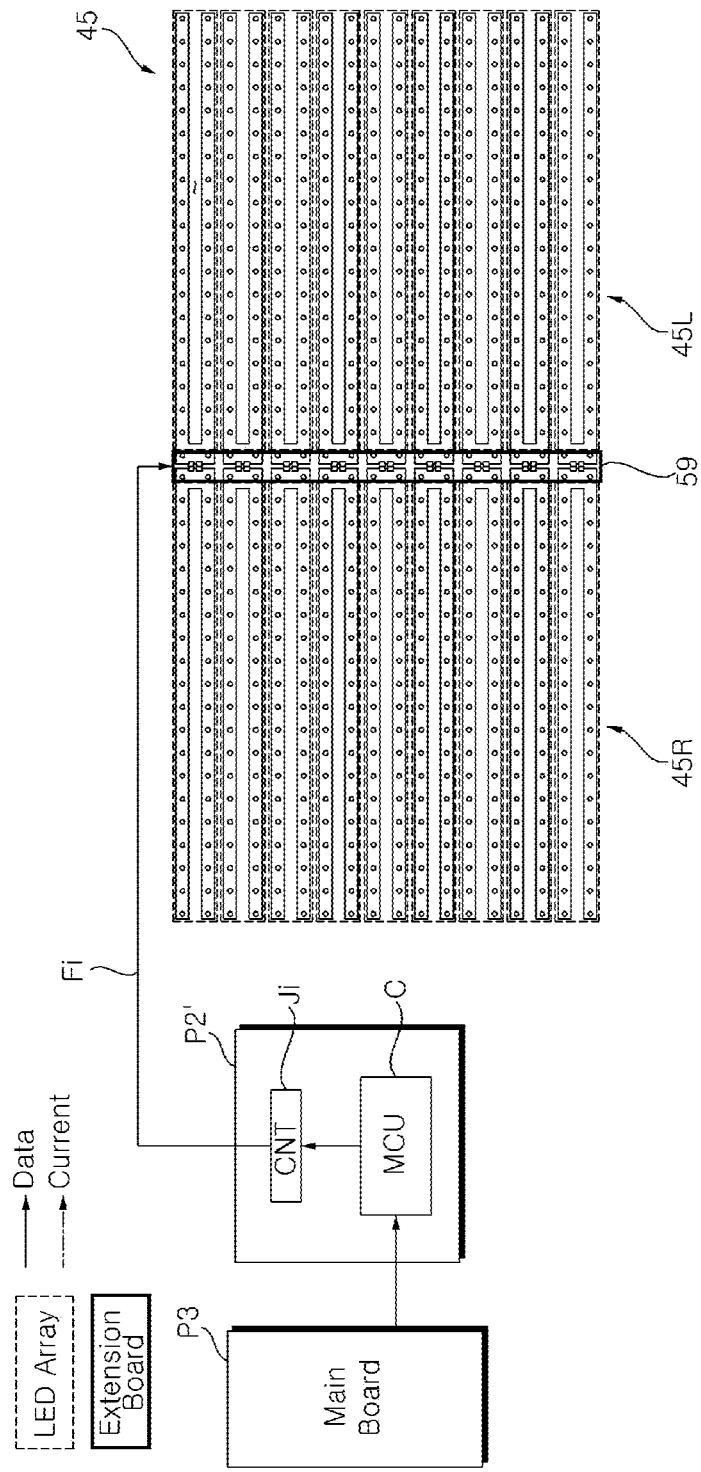

Referring to FIGS. 29 and 30, the driver IC (U) may not be provided in the LED driver board P2', and may be provided in the extension board 59. The processor C of the LED driver board P2' may be electrically connected to the driver IC U of the extension board 59 through the cable Fi connecting the connector Ji of the LED driver board P2' and the connector of the extension board 59.

The processor C of the LED driver board P2' may convert (process) data related to the image quality (e.g., brightness) of the light sources received from the main board P3 and provide it to the driver IC U of the extension board 59.

Alternatively, the LED driver board P2' may be combined with the main board P3 or the power supply board P1, and in this case, cost can be reduced as there is no need to separately prepare the LED driver board P2'.

The plurality of driver ICs U of the extension board 59 may be electrically connected to light sources 51 (i.e., first to n LED arrays) on the plurality of substrates (44, see FIG. 20; 45, see FIG. 21; 46, see FIG. 22) connected to the extension board 59.

Figure 31:
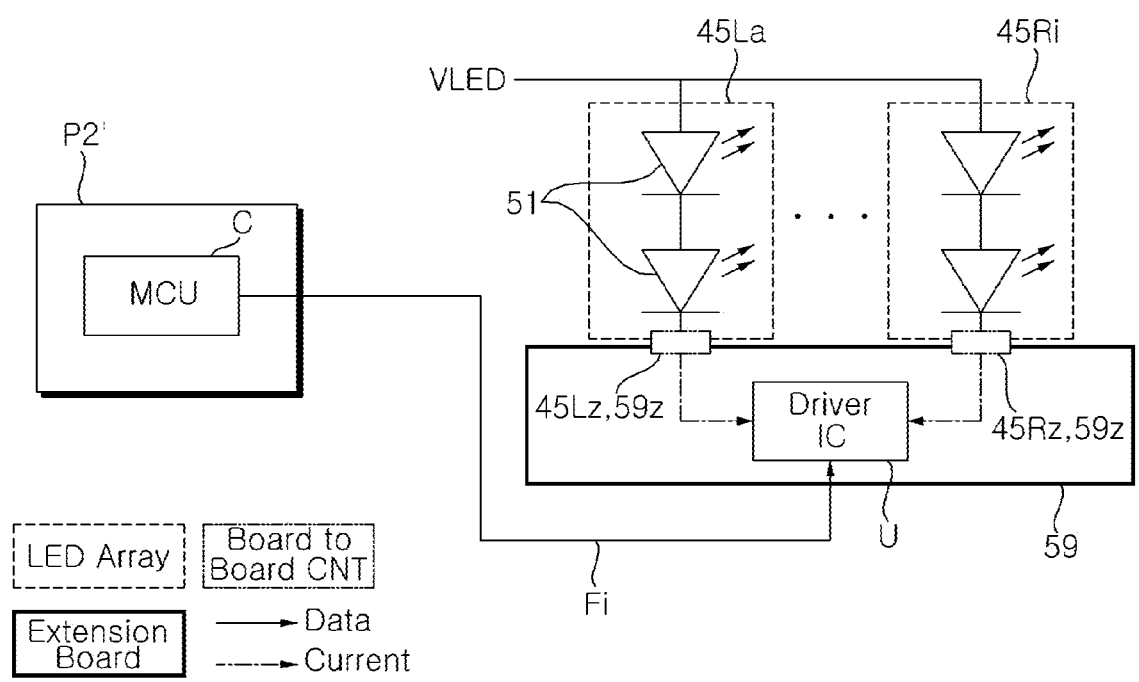
Figure 32:
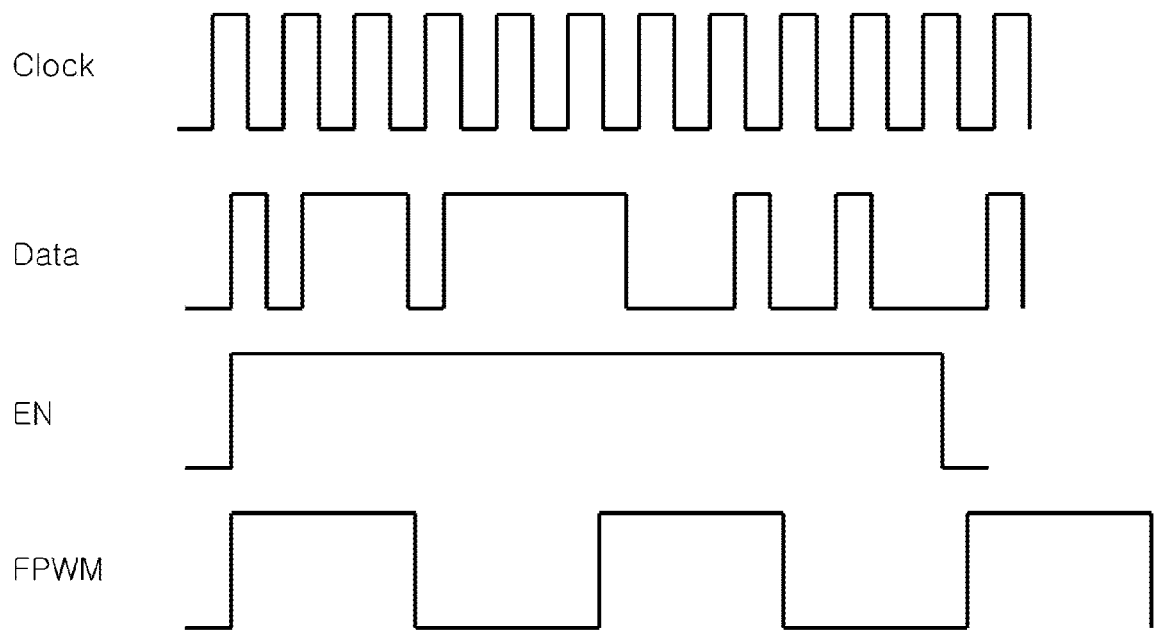

Referring to FIGS. 31 and 32, the power VLED may be supplied from the power supply board P1 to the plurality of connectors (44Lz, 44Rz, see FIG. 20; 45Lz, 45Rz, sec FIG. 21; 46Lz, 46Rz, sec FIG. 22) of the plurality of substrates (44, see FIG. 20; 45, see FIG. 21; 46, sec FIG. 22) through the LED driver board P2', the cable Fi, and the extension board 59. The power VLED of each of the plurality of connectors (44Lz, 44Rz; 45Lz, 45Rz; 46Lz, 46Rz) may be provided to the light sources 51 of each of the plurality of substrate 44, 45, 46. The current passing through the light sources 51 may flow to each of the plurality of driver ICs U through each of the plurality of connectors (44Lz, 44Rz; 45Lz, 45Rz; 46Lz, 46Rz).

The light sources 51 of each of the plurality of substrates 44, 45, 46 may be grouped into a plurality of local dimming blocks. Each of the plurality of connectors (44Lz, 44Rz; 45Lz, 45Rz; 46Lz, 46Rz) may include a power pin to which power VLED is supplied, and block pins connected to the local dimming blocks and the driver IC (U). The power pin may be electrically connected to each local dimming block through a circuit on the substrate, and the block pins may also be electrically connected to each local dimming block through a circuit on the substrate. The number of block pins may be the same as the number of local dimming blocks. The driver IC (U) may adjust the amount of current flowing to the light sources 51 belonging to each local dimming block or may block the flow of current at between the power pin and the block pins, so that the light sources 51 belonging to each local dimming block can be adjusted, and as a result, local dimming can be implemented.

For example, the forty light sources 51 of the first substrate (44La, sec FIG. 20; 45La, see FIG. 21; 46La, sec FIG. 22) may be grouped into ten local dimming blocks BL1, BL2, BL3, BL4, BL5, BL6, BL7, BL8, BL9, BL10. The first connector (44Lz, see FIG. 20; 45Lz, sec FIG. 21; 46Lz, sec FIG. 22) of the first substrate 44La, 45La, 46La may include one power pin to receive power VLED from the extension board 59, and ten block pins. A first circuit on the first substrate 44La, 45La, 46La connected to the power pin may be branched into each of the ten local dimming blocks BL1, BL2, BL3, BL4, BL5, BL6, BL7, BL8, BL9, BL10, and may connect sequentially the light sources 51 of each of ten local dimming blocks BL1, BL2, BL3, BL4, BL5, BL6, BL7, BL8, BL9, BL10. Each of the second to eleventh circuits on the first substrate 44La, 45La, 46La may electrically connect each of the ten local dimming blocks BL1, BL2, BL3, BL4, BL5, BL6, BL7, BL8, BL9, BL10 and each of the ten block pins. The second to eleventh circuits may be opposite to the first circuit with respect to the local dimming blocks BL1, BL2, BL3, BL4, BL5, BL6, BL7, BL8, BL9, BL10. The ten block pins may be electrically connected to the driver IC U of the extension board 59.

In this case, the power VLED may be supplied to the first local dimming block BL1 through the above first circuit, and the current passed through the first local dimming block BL1 may flow to the driver IC U of the extension board 59 via the second circuit and the first block pin. Similarly, the power VLED may be supplied to each of the second to tenth local dimming blocks BL2, BL3, BL4, BL5, BL6, BL7, BL8, BL9, BL10 via the first circuit, and the current passed through each of the second to tenth local dimming blocks BL2, BL3, BL4, BL5, BL6, BL7, BL8, BL9, BL10 may flow to the driver IC (U) of the extension board 59 via each of the third to eleventh circuits and each of the second to tenth block pins. At this time, the driver IC U may adjust the amount of current flowing to the light sources 51 belonging to each of the local dimming blocks BL1, BL2, BL3, BL4, BL5, BL6, BL7, BL8, BL9, BL10, or may block the flow of current, so that the brightness of the light sources 51 belonging to each local dimming block BL1, BL2, BL3, BL4, BL5, BL6, BL7, BL8, BL9, BL10 can be adjusted, and as a result, local dimming can be implemented.

Such local dimming can be driven by transmitting data related to the brightness of the light sources of the processor C through a serial peripheral interface (SPI) method to the cable Fi.

Referring to FIGS. 1 to 32, a display device according to an aspect of the present disclosure may include: a display panel; a frame which is positioned behind the display panel, and to which the display panel is coupled; a plurality of substrates positioned between the display panel and the frame, and coupled to the frame; a plurality of light sources positioned on the plurality of substrates; and an extension board which includes a driver chip, which extends in a direction intersecting the plurality of substrates, and to which the plurality of substrates are coupled.

The driver chip may adjust the brightness of the light sources based on data related to the brightness of the plurality of light sources. The plurality of light sources may be grouped into a plurality of local dimming blocks, and the driver chip may adjust the brightness of each of the plurality of local dimming blocks.

The display device may further include: a main board coupled to the frame; and a cable electrically connected to the main board and the extension board, and transmitting data related to a brightness of the light sources of the main board to the driver chip.

The display device may further include: a Light Emitting Diode (LED) driver board including a processor for processing the data of the main board, and coupled to the frame; and a power supply board coupled to the frame, and electrically connected to the LED driver board, and the cable may be electrically connected to the LED driver board and the extension board, and may transmit data of the processor to the driver chip.

The LED driver board may be formed as one body with the main board or the power supply board.

The cable may be a flexible flat cable (FFC).

The plurality of substrates may be a single sided Printed Circuit Board (PCB), the extension board may be a single sided PCB or a double-sided Printed Circuit Board (PCB), and the driver chip may be mounted on a first surface of the extension board facing the display panel or on a second surface opposite the first surface.

The plurality of substrates may be a Metal Core Printed Circuit Board (MCPCB), and the driver chip may be mounted on the second surface.

The plurality of light sources may be grouped into a plurality of local dimming blocks for each of the plurality of substrates, and the driver chip may include a plurality of driver chips spaced apart from each other in a length direction of the extension board, and electrically connected to the plurality of local dimming blocks.

The extension board may include a plurality of mounting connectors alternately disposed with the plurality of driver chips in the length direction of the extension board, and coupled to the plurality of substrates.

The plurality of substrates may include: a first substrate; and a second substrate opposite to the first substrate with respect to the extension board, wherein the extension board may include a mounting connector positioned between the first substrate and the second substrate, the mounting connector having a first groove formed at a first side of the mounting connector facing the first substrate, and a second groove formed at a second side of the mounting connector facing the second substrate, and the display device may further include: a first connector including a first pin inserted into the first groove, and electrically connected to the first substrate; and a second connector including a second pin inserted into the second groove, and electrically connected to the second substrate.

The display device may further include a reflective sheet positioned on the plurality of substrates, and having holes in which the plurality of light sources are positioned, and the reflective sheet may include a plurality of cutting lines facing the first and second connectors.

The plurality of substrates may include: a plurality of first substrates coupled to the extension board adjacent to one long side of the extension board; and a plurality of second substrates coupled to the extension board adjacent to the other long side of the extension board, and the first substrate and the second substrate may have the same shape.

Each of the plurality of substrates may have a bar shape, and the plurality of light sources may be arranged in at least two rows on the substrate.

Each of the plurality of substrates may include: a body extending in a length direction of the extension board; and a plurality of legs extending from the body in a direction intersecting the body, and spaced apart from each other, and the plurality of light sources are arranged in a plurality of rows along the plurality of legs on the substrate.

Each of the plurality of substrates may include: a body extending in a direction intersecting a length direction of the extension board; and a plurality of legs extending from the body in a direction intersecting the body, and spaced apart from each other, and the plurality of light sources are arranged in at least two rows on the substrate.

The effect of the display device according to the present disclosure will be described as follows.

According to at least one of the embodiments of the present disclosure, it is possible to provide a structure capable of minimizing the number of connectors and cables that connect a LED driver and LED substrates even if the number of local dimming blocks is large.

According to at least one of the embodiments of the present disclosure, it is possible to provide a structure capable of reducing the cost and working time required for connectors and cables and simplifying the layout of a frame.

According to at least one of the embodiments of the present disclosure, it is possible to provide a structure capable of combining an LED driver board with a main board or a power supply board.

According to at least one of the embodiments of the present disclosure, it is possible to provide a coupling structure between an extension board having a driver IC and substrates.

According to at least one of the embodiments of the present disclosure, it is possible to provide a various examples of the shape of the substrates connected by an extension board.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

The foregoing embodiments are merely examples and are not to be considered as limiting the present disclosure. The scope of the present disclosure should be determined by rational interpretation of the appended claims, and all modifications within the equivalents of the disclosure are intended to be included within the scope of the present disclosure.

What is claimed is:

1. A display device comprising:
a display panel;
a frame which is positioned behind the display panel, and to which the display panel is coupled;
an extension board which is positioned between the display panel and the frame, and which is elongated;
first substrates which are disposed along a first long side of the extension board;
second substrates which are disposed along a second long side of the extension board;
light sources which are positioned on the first substrates and the second substrates;
mounting connectors which are positioned on the extension board and which are positioned between the first substrates and the second substrates; and
driver chips which are positioned on the extension board,
wherein each of the first substrates is electrically connected to a first side of each of the mounting connectors, respectively,
wherein each of the second substrates is electrically connected to a second side of each of the mounting connectors, respectively, and
wherein the mounting connectors and the driver chips are alternately disposed in a length direction of the extension board.

2. The display device of claim 1, further comprising:
a main board coupled to the frame; and
a cable electrically connected to the main board and the extension board and configured to transmit data related to a brightness of the light sources to the driver chip.

3. The display device of claim 2, further comprising:
a Light Emitting Diode (LED) driver board coupled to the frame and comprising a processor for processing data of the main board; and
a power supply board coupled to the frame and electrically connected to the LED driver board,
wherein the cable is electrically connected to the LED driver board and the extension board, and transmits data of the processor to the driver chip.

4. The display device of claim 3, wherein the LED driver board is integrally formed with the main board or the power supply board.

5. The display device of claim 2, wherein the cable is a flexible flat cable (FFC).

6. The display device of claim 1, wherein each of the first substrates and the second substrates is a single sided Printed Circuit Board (PCB),
wherein the extension board is a single sided PCB or a double-sided PCB, and
wherein the driver chips are mounted on a first surface of the extension board facing the display panel or on a second surface opposite the first surface.

7. The display device of claim 6, wherein the first substrates and the second substrates are a Metal Core Printed Circuit Board (MCPCB), and
wherein the driver chips are mounted on the second surface.

8. The display device of claim 1, wherein the light sources are respectively grouped into a plurality of local dimming blocks corresponding to each of the first substrates and the second substrates, and
wherein the driver chips are spaced apart from each other along the length direction of the extension board, and electrically connected to the plurality of local dimming blocks.

9. The display device of claim 1, wherein the mounting connectors and the driver chips are arranged in a row along the length direction of the extension board.

10. The display device of claim 1,
wherein each of the mounting connectors comprises a first groove formed at the first side of each of the mounting connectors facing the first substrates, and a second groove formed at the second side of each of the mounting connectors facing the second substrates,
wherein each of a first connectors is electrically connected to each of the first substrates and comprises a first pin configured to be inserted into the first groove; and
wherein each of a second connectors is electrically connected to each of the second substrates and comprises a second pin configured to be inserted into the second groove.

11. The display device of claim 10, further comprising a reflective sheet positioned on the first substrates and the second substrates and comprising holes corresponding to the light sources,
wherein the reflective sheet comprises a plurality of cut lines facing the first and second connectors.

12. The display device of claim 1,
wherein the first substrates and the second substrates have the same shape.

13. The display device of claim 1, wherein each of the first substrates and the second substrates has a bar shape, and
wherein the light sources are arranged in at least two rows on each of the first substrates and the second substrates.

14. The display device of claim 1, wherein each of the first substrates and the second substrates comprises:
a body extending in a length direction of the extension board; and
a plurality of legs spaced apart from each other and extending from the body in a direction intersecting the length direction of the extension board,
wherein the light sources are arranged in rows along the plurality of legs on the first substrates and the second substrates.

15. The display device of claim 1, wherein each of the first substrates and the second substrates comprises:
a body extending in a direction intersecting the length direction of the extension board; and
a plurality of legs spaced apart from each other and extending from the body in the length direction of the extension board,
wherein the light sources are arranged in at least two rows on the first substrates and the second substrates.

* * * * *